(12) United States Patent
Cheng et al.

(10) Patent No.: US 9,543,353 B2
(45) Date of Patent: Jan. 10, 2017

(54) FORMATION OF BURIED COLOR FILTERS IN A BACK SIDE ILLUMINATED IMAGE SENSOR WITH AN ONO-LIKE STRUCTURE

(71) Applicant: TAIWAN SEMICONDUCTOR MANUFACTURING COMPANY, LTD., Hsin-Chu (TW)

(72) Inventors: Yun-Wei Cheng, Taipei (TW); Chiu-Jung Chen, Tainan (TW); Volume Chien, Tainan (TW); Kuo-Cheng Lee, Tainan (TW); Yung-Lung Hsu, Tainan (TW); Hsin-Chi Chen, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/168,816

(22) Filed: May 31, 2016

(65) Prior Publication Data

US 2016/0276400 A1    Sep. 22, 2016

Related U.S. Application Data

(60) Division of application No. 14/308,760, filed on Jun. 19, 2014, now Pat. No. 9,368,531, which is a
(Continued)

(51) Int. Cl.
*H01L 27/146* (2006.01)
*H01L 21/02* (2006.01)
*H01L 21/311* (2006.01)

(52) U.S. Cl.
CPC ..... *H01L 27/14685* (2013.01); *H01L 21/0217* (2013.01); *H01L 21/02164* (2013.01);
(Continued)

(58) Field of Classification Search
CPC ............ H01L 27/146; H01L 27/1463; H01L 27/14685; H01L 27/14621; H01L 27/1464; H01L 27/14629; H01L 27/14627; H01L 27/48; H01L 21/30; H01L 31/0216
See application file for complete search history.

(56) References Cited

U.S. PATENT DOCUMENTS

2010/0230729 A1    9/2010   Ellis-Monaghan et al.
2012/0049306 A1*   3/2012   Ohba ................. H01L 27/1462
                                                257/432

(Continued)

OTHER PUBLICATIONS

International Search Report and Written Opinion issued for PCT/US2013/054795 dated May 23, 2014, 14 pages.

*Primary Examiner* — Selim Ahmed
(74) *Attorney, Agent, or Firm* — Haynes and Boone, LLP

(57) ABSTRACT

A semiconductor image sensor includes a substrate having a first side and a second side that is opposite the first side. An interconnect structure is disposed over the first side of the substrate. A plurality of radiation-sensing regions is located in the substrate. The radiation-sensing regions are configured to sense radiation that enters the substrate from the second side. A plurality of light-blocking structures is disposed over the second side of the substrate. A passivation layer is coated on top surfaces and sidewalls of each of the light-blocking structures. A plurality of spacers is disposed on portions of the passivation layer coated on the sidewalls of the light-blocking structures.

20 Claims, 28 Drawing Sheets

Related U.S. Application Data continuation of application No. 14/307,781, filed on Jun. 18, 2014.

(52) U.S. Cl.
CPC .... *H01L 21/31116* (2013.01); *H01L 27/1462* (2013.01); *H01L 27/1464* (2013.01); *H01L 27/14621* (2013.01); *H01L 27/14623* (2013.01); *H01L 27/14645* (2013.01); *H01L 27/14689* (2013.01)

(56) References Cited

U.S. PATENT DOCUMENTS

| | | |
|---|---|---|
| 2012/0147208 A1 | 6/2012 | Otsuka et al. |
| 2014/0339606 A1 | 11/2014 | Lin et al. |

\* cited by examiner

FORMATION OF BURIED COLOR FILTERS IN A BACK SIDE ILLUMINATED IMAGE SENSOR WITH AN ONO-LIKE STRUCTURE

PRIORITY DATA

This application is a divisional application of U.S. patent application Ser. No. 14/308,760 filed Jun. 19, 2014, now U.S. Pat. No. 9,368,531, issued Jun. 14, 2016, which is a continuation application of U.S. patent application Ser. No. 14/307,781, filed Jun. 18, 2014, the disclosures of each are hereby incorporated by reference in their entirety.

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels (which may include photodiodes and transistors) in a substrate to absorb (i.e., sense) radiation that is projected toward the substrate and convert the sensed radiation into electrical signals.

A back side illuminated (BSI) image sensor device is one type of image sensor device. These BSI image sensor devices are operable to detect light from the backside. Compared to front side illuminated (FSI) image sensor devices, BSI image sensor devices have improved performance, especially under low light conditions. However, traditional methods of fabricating BSI image sensor devices may still lead to certain shortcomings for BSI image sensor devices. For example, the fabrication of traditional BSI image sensors generally forms a color filter array on a flat surface above a light-blocking metal grid. However, the disposition of the color filter array above the metal grid leads to a longer optical path for the light before it can be detected by a desired pixel. The disposition of the color filter array above the metal grid also requires accurate alignment between the color filter array and the metal grid, as any misalignment may cause undesirable cross-talk between adjacent pixels.

Hence, while existing BSI image sensor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
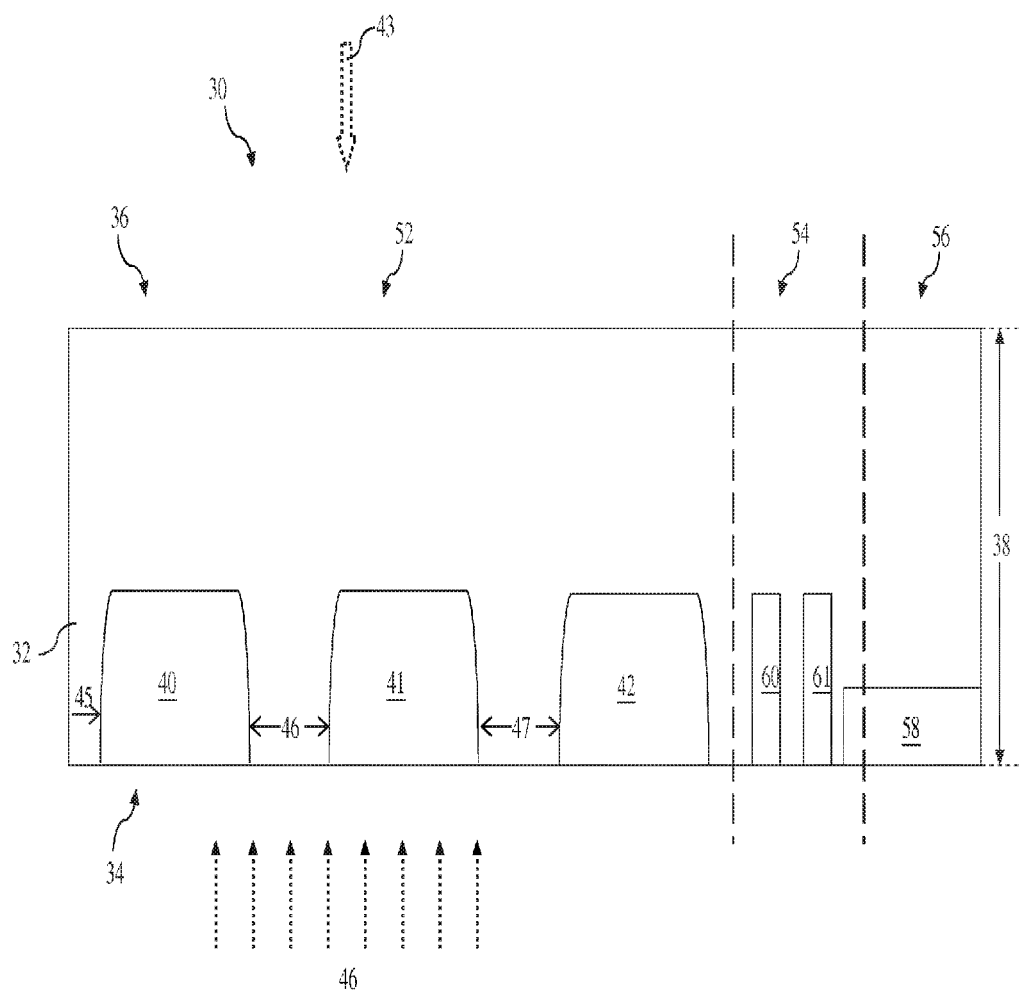
FIGS. 1-26 are simplified fragmentary cross-sectional side views of a portion of an image sensor device at various stages of fabrication in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-26 are simplified diagrammatic fragmentary sectional side views a BSI image sensor device 30 at various stages of fabrication according to aspects of the present disclosure. The image sensor device 30 includes an array or grid of pixels for sensing and recording an intensity of radiation (such as light) directed toward a back-side of the image sensor device 30. The image sensor device 30 may include a charge-coupled device (CCD), complementary metal oxide semiconductor (CMOS) image sensor (CIS), an active-pixel sensor (APS), or a passive-pixel sensor. The image sensor device 30 further includes additional circuitry and input/outputs that are provided adjacent to the grid of pixels for providing an operation environment for the pixels and for supporting external communication with the pixels. It is understood that FIGS. 2 to 6 have been simplified for a better understanding of the inventive concepts of the present disclosure and may not be drawn to scale.

With reference to FIG. 1, the image sensor device 30 includes a device substrate 32. In the illustrated embodiment, the device substrate 32 contains a silicon material doped with a p-type dopant such as boron (for example a p-type substrate). Alternatively, the device substrate 32 could contain another suitable semiconductor material. For example, the device substrate 32 may include silicon that is doped with an n-type dopant such as phosphorous or arsenic (an n-type substrate). The device substrate 32 could also contain other elementary semiconductors such as germanium and diamond. The device substrate 32 could optionally include a compound semiconductor and/or an alloy semiconductor. Further, the device substrate 32 could include an epitaxial layer (epi layer), may be strained for performance enhancement, and may include a silicon-on-insulator (SOI) structure.

The device substrate 32 has a front side (also referred to as a front surface) 34 and a back side (also referred to as a back surface) 36. The device substrate 32 also has an initial thickness 38 that is in a range from about 100 microns (um) to about 3000 um. In the present embodiment, the initial thickness 38 is in a range from about 500 um to about 1000 um.

Radiation-sensing regions—for example, pixels 40, 41, and 42—are formed in the device substrate 32. The pixels 40-42 are configured to sense radiation (or radiation waves), such as an incident light 43, that is projected toward device substrate 32 from the back side 36. The light 43 would enter the device substrate 32 through the back side 36 (or the back surface) and be detected by one or more of the pixels 40-42. The pixels 40-42 each include a photodiode in the present embodiment. In other embodiments, the pixels 40-42 may include pinned layer photodiodes, photogates, reset transistors, source follower transistors, and transfer transistors. The pixels 40-42 may also be referred to as radiation-detection devices or light-sensors.

The pixels 40-42 may be varied from one another to have different junction depths, thicknesses, widths, and so forth. For the sake of simplicity, only three pixels 40-42 are illustrated in FIG. 1, but it is understood that any number of pixels may be implemented in the device substrate 32. In the embodiment shown, the pixels 40-42 are formed by performing an implantation process 46 on the device substrate 32 from the front side 34. The implantation process 46 includes doping the device substrate 32 with a p-type dopant such as boron. In an alternative embodiment, the implantation process 46 may include doping the device substrate 32 with an n-type dopant such as phosphorous or arsenic. In other embodiments, the pixels 40-42 may also be formed by a diffusion process.

The pixels 40-42 are separated from one another by a plurality of gaps in the device substrate 32. For example, a gap 45 separates the pixel 40 from an adjacent pixel to its left (not illustrated), a gap 46 separates the pixels 40-41, and a gap 47 separates the pixels 41-42. Of course, it is understood that the gaps 45-47 are not voids or open spaces in the device substrate 32, but they may be regions of the device substrate 32 (either a semiconductor material or a dielectric isolation element) that are located between the adjacent pixels 40-42.

Still referring to FIG. 1, the pixels 40-42 are formed in a region of the image sensor device 30 referred to as a pixel region 52 (or a pixel-array region). In addition to the pixel region 52, the image sensor 30 may also include a periphery region 54 and a bonding pad region 56. The dashed lines in FIG. 1 designate the approximate boundaries between the regions 52, 54, and 56, though it is understood that these regions 52, 54, and 56 are not drawn in scale herein and may extend vertically above and below the device substrate 32.

The periphery region 54 includes devices 60 and 61 that need to be kept optically dark. For example, the device 60 in the present embodiment may be a digital device, such as an application-specific integrated circuit (ASIC) device or a system-on-chip (SOC) device. The device 61 may be a reference pixel that is used to establish a baseline of an intensity of light for the image sensor device 30.

The bonding pad region 56 includes a region where one or more bonding pads (not illustrated herein) of the image sensor device 30 will be formed in a later processing stage, so that electrical connections between the image sensor device 30 and external devices may be established. Among other things, the bonding pad region 56 may contain an isolation structure, such as a shallow trench isolation (STI) 58. The STI 58 partially extends into the periphery region 54. One function of the STI 58 is that it helps insulate the silicon of the device substrate 32 from a conductive pad to be formed in the bonding pad region 56, which will be discussed below in more detail.

Although not illustrated herein for reasons of simplicity, it is understood that the image sensor 30 may also include a scribe line region. The scribe line region includes a region that separates one semiconductor die (for example, a semiconductor die that includes the bonding pad region 56, the periphery region 54, and the pixel region 52) from an adjacent semiconductor die (not illustrated). The scribe line region is cut therethrough in a later fabrication process to separate adjacent dies before the dies are packaged and sold as integrated circuit chips. The scribe line region is cut in such a way that the semiconductor devices in each die are not damaged.

Figure 2:
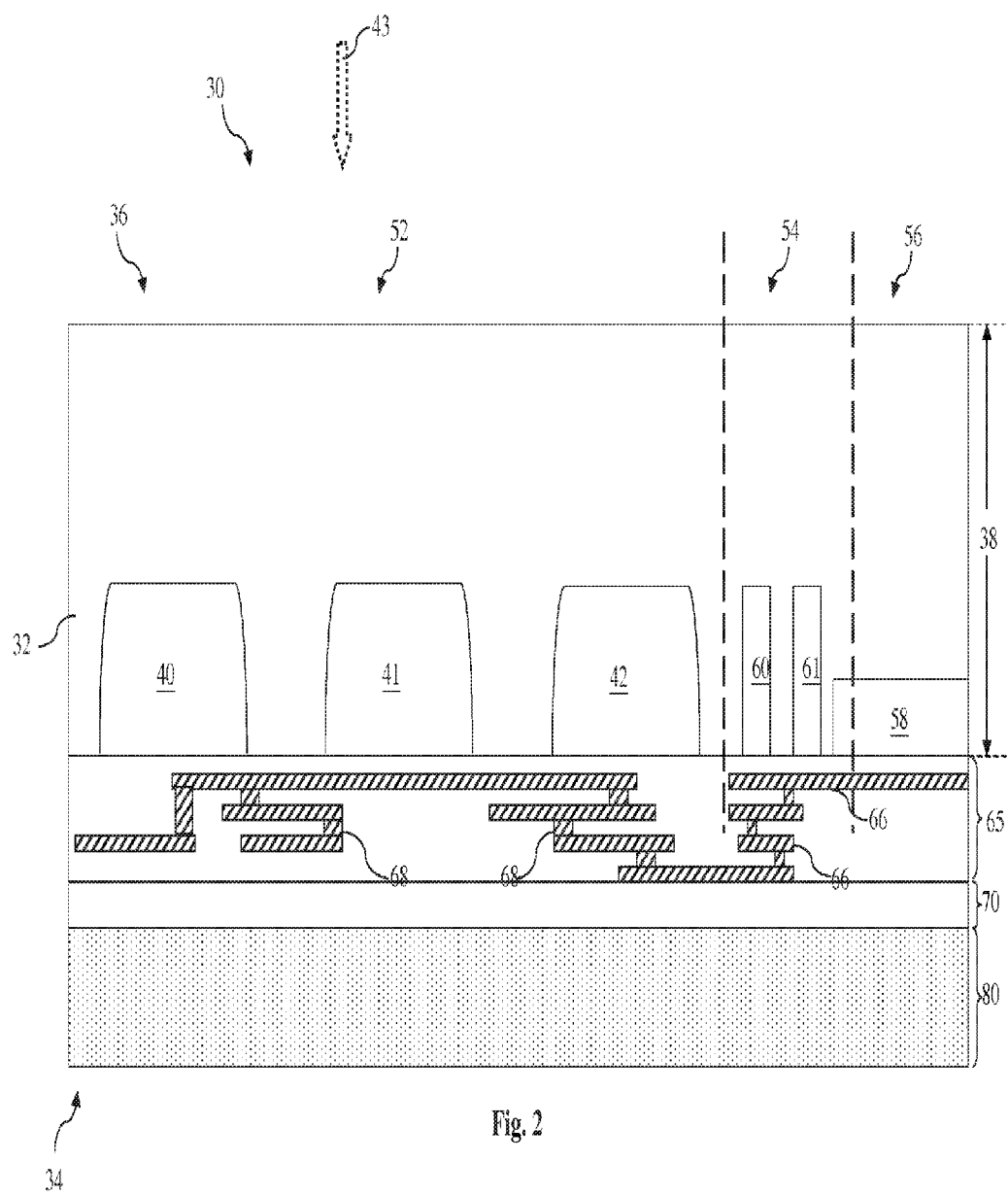

Referring now to FIG. 2, an interconnect structure 65 is formed over the front side 34 of the device substrate 32. The interconnect structure 65 includes a plurality of patterned dielectric layers and conductive layers that provide interconnections (e.g., wiring) between the various doped features, circuitry, and input/output of the image sensor device 30. The interconnect structure 65 includes an interlayer dielectric (ILD) and a multilayer interconnect (MLI) structure. The MLI structure includes contacts, vias and metal lines. For purposes of illustration, a plurality of conductive lines 66 and vias/contacts 68 are shown in FIG. 2, it being understood that the conductive lines 66 and vias/contacts 68 illustrated are merely exemplary, and the actual positioning and configuration of the conductive lines 66 and vias/contacts 68 may vary depending on design needs.

The MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts 68) and horizontal connection (for example, conductive lines 66). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

Still referring to FIG. 2, a buffer layer 70 is formed over the front side 34 of the interconnect structure 80. In the present embodiment, the buffer layer 70 includes a dielectric material such as silicon oxide ($SiO_2$). Alternatively, the buffer layer 70 may optionally include silicon nitride (SiN). The buffer layer 70 may be formed by CVD, PVD, or other suitable techniques. The buffer layer 70 is planarized to form a smooth surface by a CMP process.

Thereafter, a carrier substrate 80 is bonded with the device substrate 40 through the buffer layer 100 and the interconnect structure 65, so that processing of the back side 36 of the device substrate 32 can be performed. The carrier substrate 80 in the present embodiment is similar to the device substrate 32 and includes a silicon material. Alternatively, the carrier substrate 80 may include a glass substrate or another suitable material. The carrier substrate 80 may be bonded to the device substrate 32 by molecular forces—a technique known as direct bonding or optical fusion bonding—or by other bonding techniques known in the art, such as metal diffusion or anodic bonding.

Among other things, the buffer layer 70 provides electrical isolation between the device substrate 32 and the carrier substrate 80. The carrier substrate 80 provides protection for the various features formed on the front side 34 of the device substrate 32, such as the pixels 40-42 formed therein. The carrier substrate 80 also provides mechanical strength and support for processing of the back side 36 of the device substrate 32 as discussed below. After bonding, the device substrate 32 and the carrier substrate 80 may optionally be annealed to enhance bonding strength.

Figure 3:
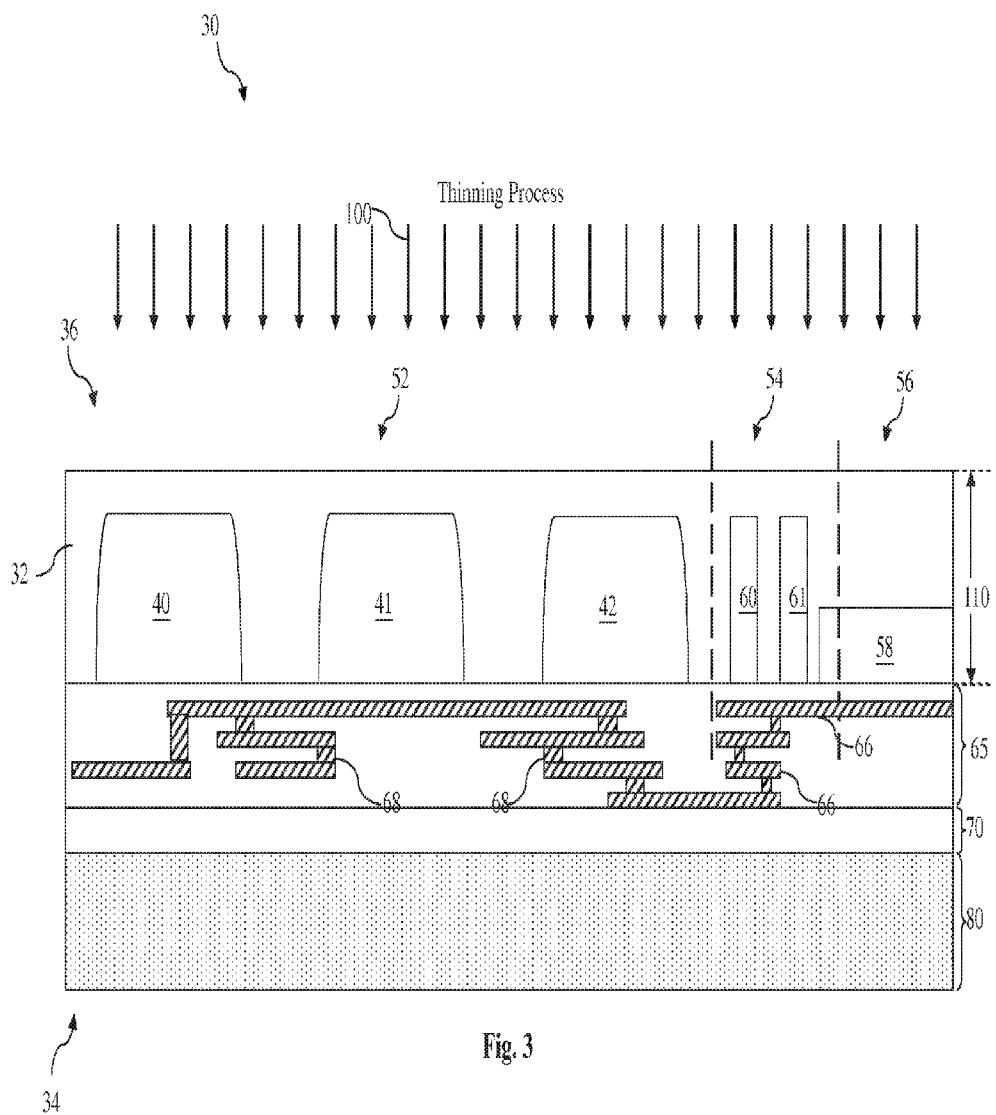

Referring now to FIG. 3, after the carrier substrate 80 is bonded to the device substrate 32, a thinning process 100 is then performed to thin the device substrate 32 from the backside 36. The thinning process 100 may include a mechanical grinding process and a chemical thinning process. A substantial amount of substrate material may be first removed from the device substrate 32 during the mechanical grinding process. Afterwards, the chemical thinning process may apply an etching chemical to the back side 36 of the device substrate 32 to further thin the device substrate 32 to a thickness 110, which is on the order of a few microns. In some embodiments, the thickness 110 is greater than about 1 um but less than about 3 um. It is also understood that the particular thicknesses disclosed in the present disclosure are mere examples and that other thicknesses may be implemented depending on the type of application and design requirements of the image sensor device 30.

Figure 4:
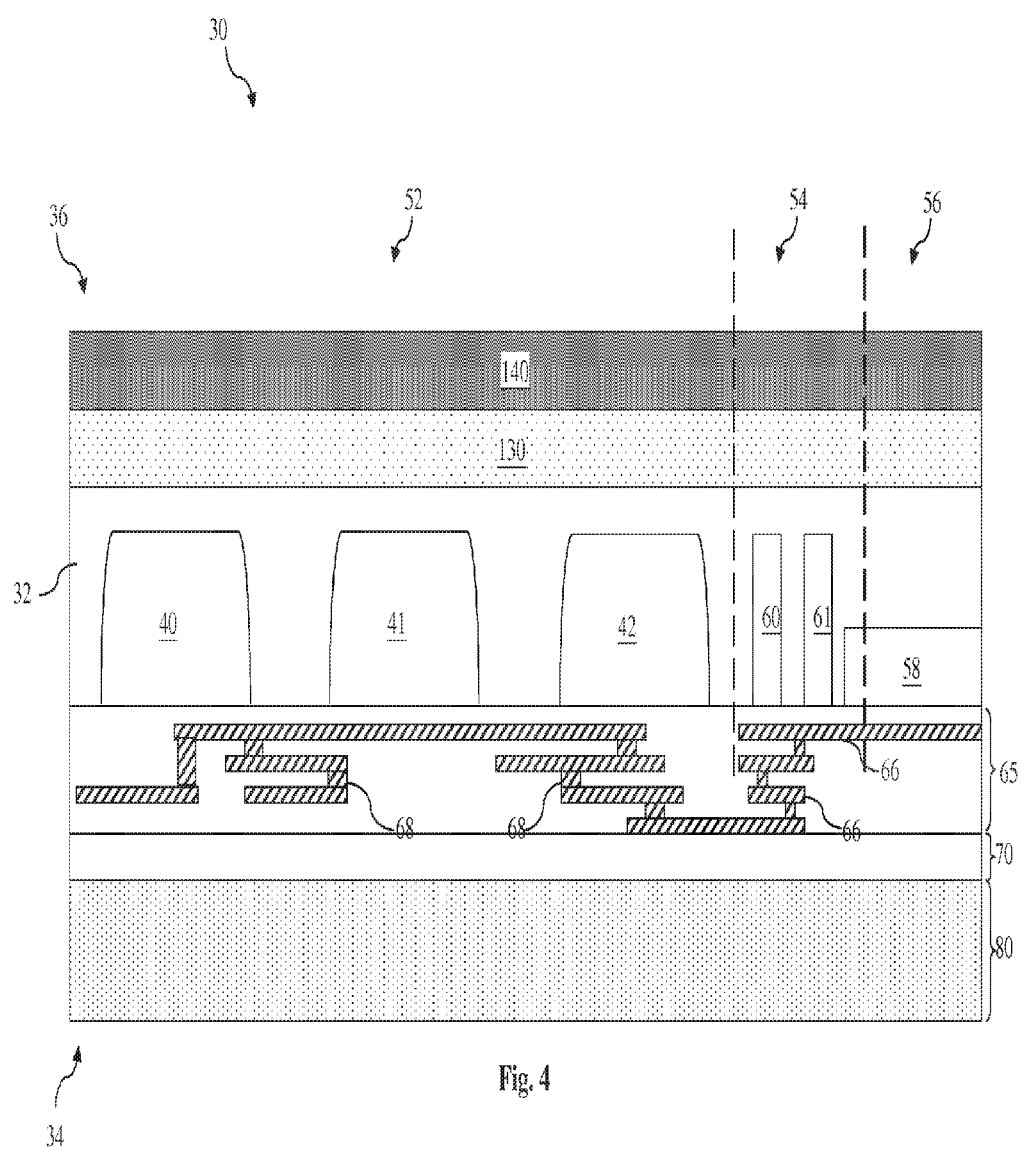

Referring now to FIG. 4, an anti-reflective coating (ARC) layer 130 is formed over the back side 36 of the device substrate 32. In some embodiments, the ARC layer 130 contains a high-k material. In other embodiments, the ARC layer 130 may contain another suitable anti-reflective material, for example SiCN, SiN, HfO, $Al_2O_3$, $Ta_2O_5$ or ZrO. A buffer layer 140 is formed over the ARC layer 130. In some embodiments, the buffer layer 140 contains silicon oxide. In other embodiments, the buffer layer 140 may contain another suitable material, for example SiCN, SiN, HfO, $Al_2O_3$, TaO or ZrO. The ARC layer 130 and the buffer layer 140 may each be formed via one or more deposition processes known in the art.

Figure 5:
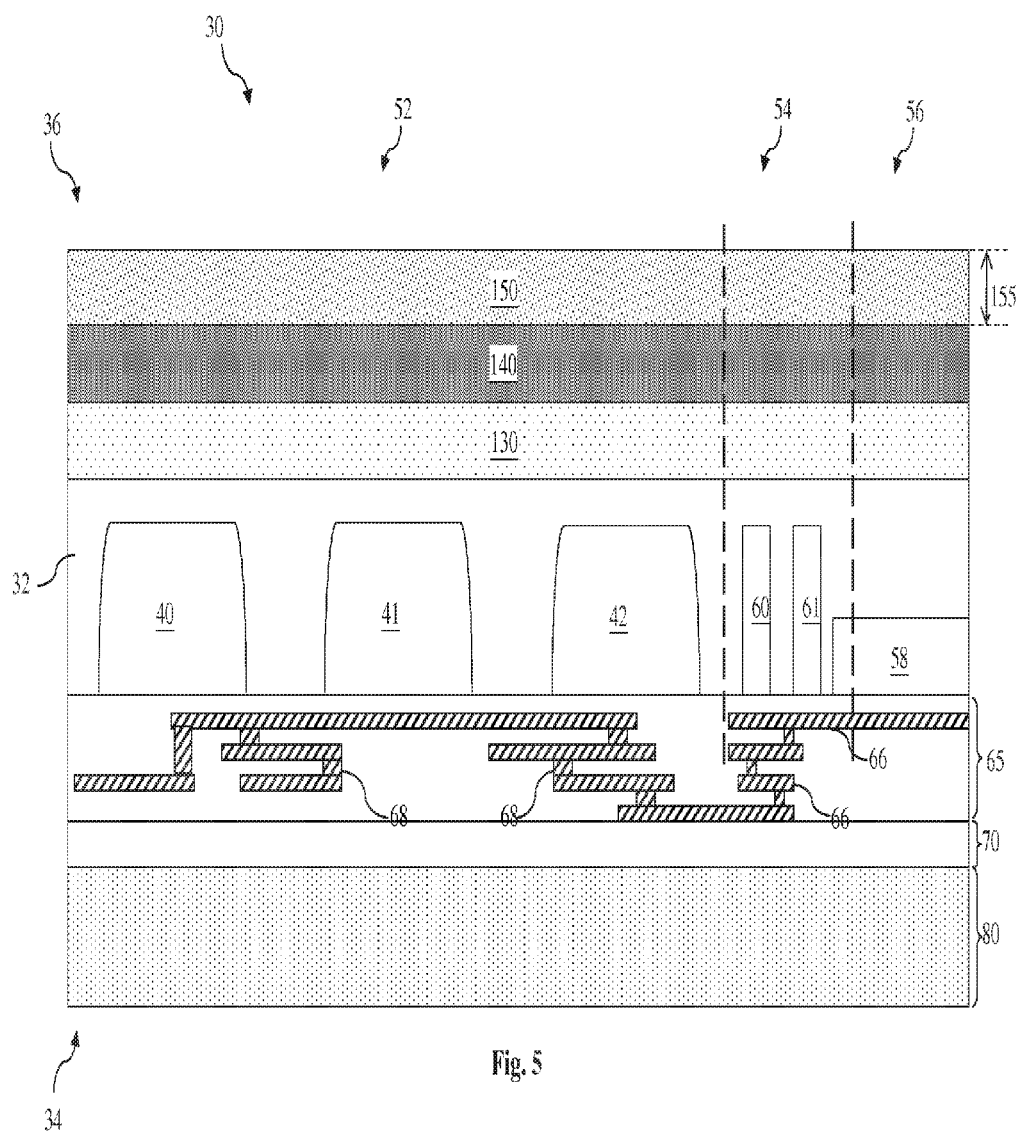

Referring now to FIG. 5, a layer 150 is formed over the buffer layer 140 on the back side 36. The layer 150 has a material composition that is different from the buffer layer 140. In some embodiments, a sufficiently high etching selectivity exists between the layer 150 and the buffer layer 140. In other words, the buffer layer 140 and the layer 150 have substantially different etching rates, such that the etching process may be performed to remove one of the layers 140 and 150 without affecting the other. In some embodiments where the buffer layer 140 contains silicon oxide, the layer 150 may contain silicon nitride (SiN), silicon carbide (SiC), silicon oxynitride (SiON), titanium nitride (TiN), or even a suitable metal or metal compound material such as tungsten (W), aluminum copper (AlCu), copper (Cu), etc. The layer 150 is formed to have a thickness 155. In some embodiments, the thickness 155 is in a range from about 100 angstroms to about 1500 angstroms. This thickness range is configured such that the layer 150 may adequately perform its function as an etching-stop layer in subsequent processes, as discussed in more detail below.

Figure 6:
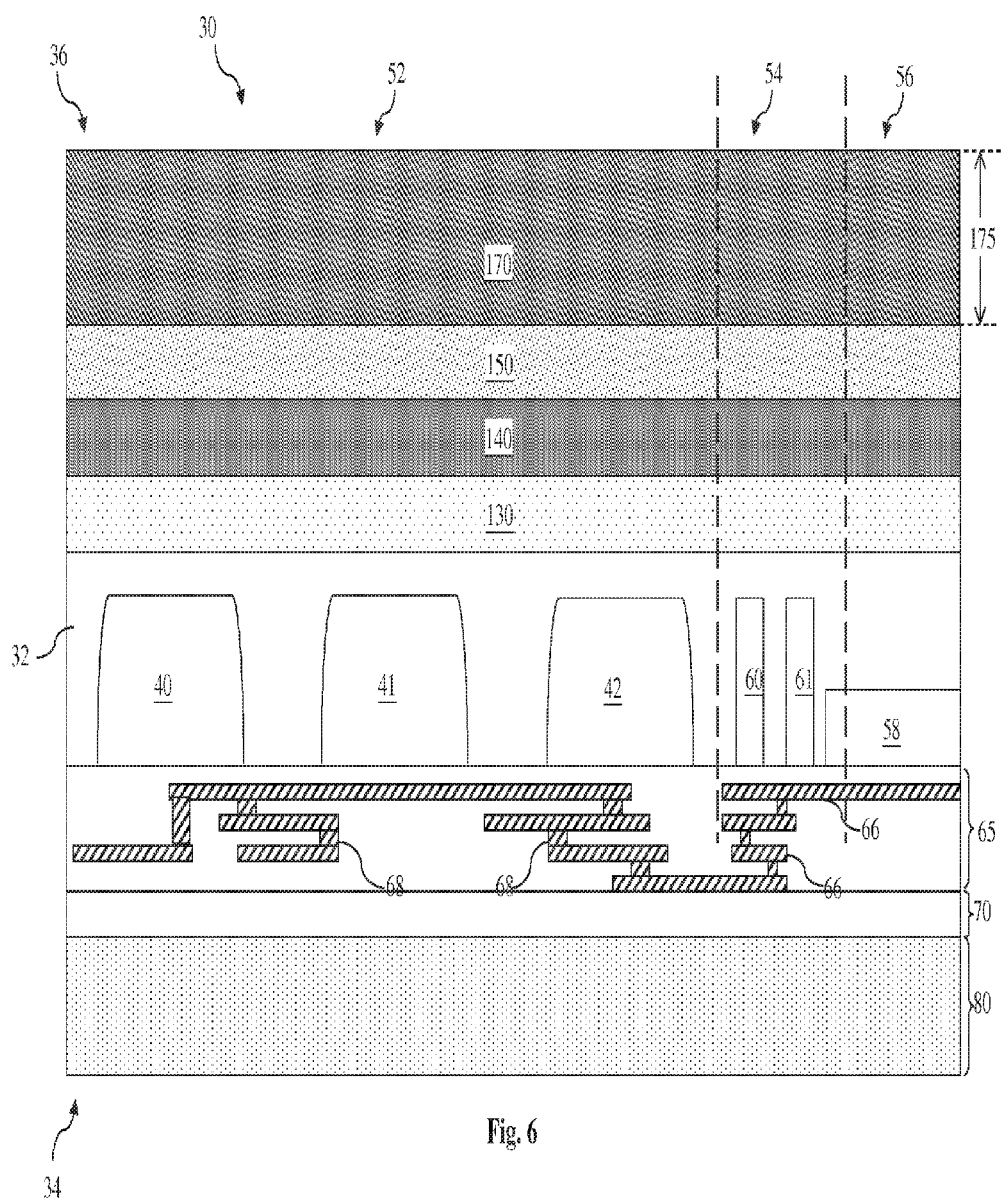

Referring now to FIG. 6, a light-blocking layer 170 (also referred to as a light-reflective layer or radiation-blocking layer) is formed over the layer 150 on the back side 36. The light-blocking layer 170 may be formed by a suitable deposition process known in the art. In various embodiments, the light-blocking layer 170 may contain a metal material, such as aluminum. In other embodiments, different types of light-blocking or light-reflective materials may be used to implement the light-blocking layer 170. The light-blocking layer 170 is formed to have a thickness 175. In some embodiments, to ensure that the light-blocking layer 170 can sufficiently block light, the thickness 175 is formed to be in a range from about 500 angstroms to about 5000 angstroms.

Figure 7:
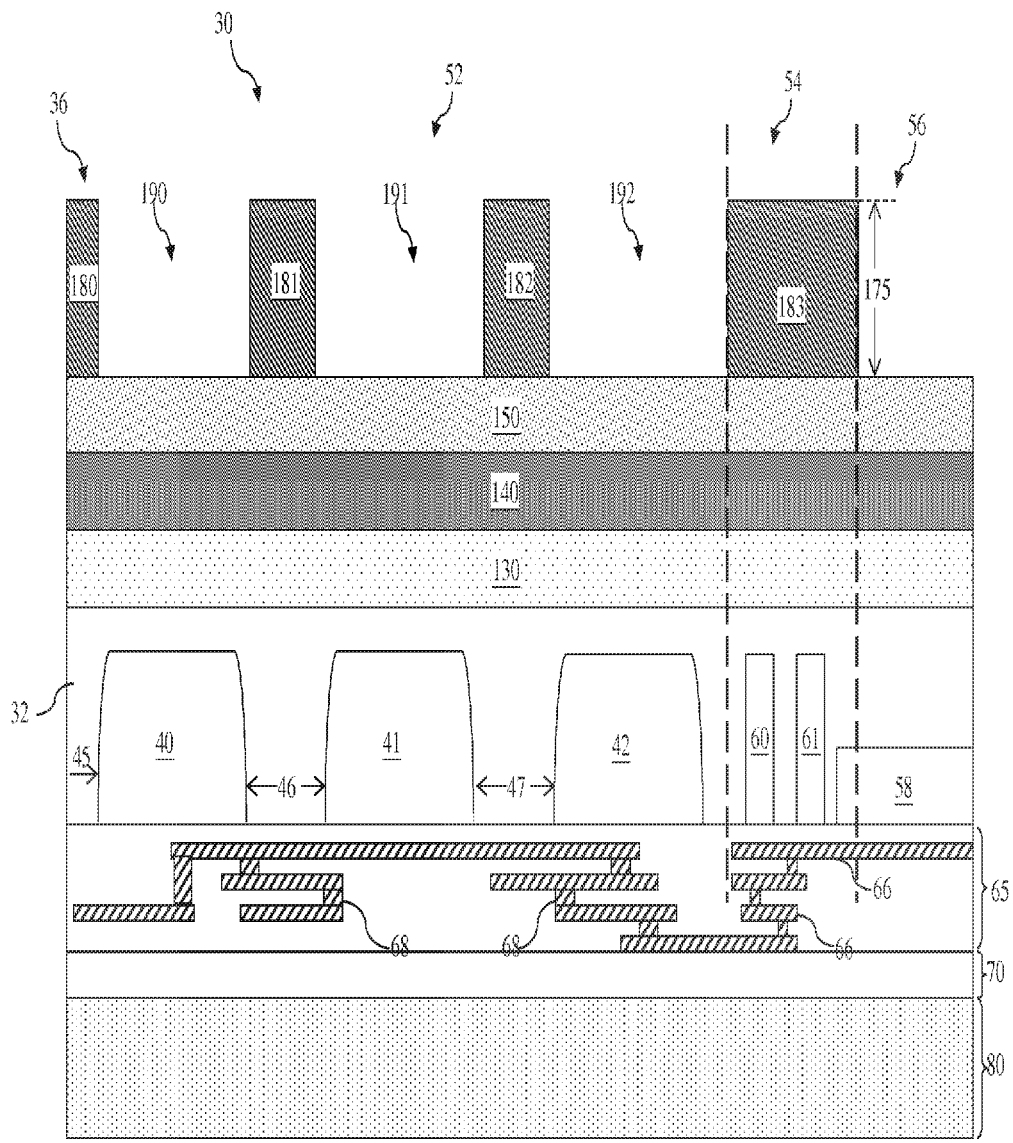

Referring now to FIG. 7, the light-blocking layer 170 is patterned into a plurality of light-blocking structures 180-183. The patterning of the light-blocking layer 170 may involve one or more photolithography processes known in the art. As a result, the light blocking structures 180-182 are formed in the pixel region 52, and the light-blocking structure 183 is formed in the periphery region 54. The light-blocking structures 180-184 may collectively be referred to as a "metal grid."

The light-blocking structures 180-182 are each vertically aligned with a respective one of the gaps 45-47 that separate adjacent pixels 40-42. For example, the light-blocking structure 180 is vertically aligned with the gap 45 that separates the pixel 40 from the pixel located to its left (not illustrated herein), the light-blocking structure 181 is vertically aligned with the gap 46 that separates the pixels 40 and 41, and the light-blocking structure 182 is vertically aligned with the gap 47 that separates the pixels 41 and 42.

In this manner, the light-blocking structures 180-182 reduce cross-talk. In more detail, cross-talk may arise when light targeted for one pixel (e.g., pixel 41) spreads to one or more neighboring pixels (e.g., pixels 40 or 42). Cross-talk will negatively affect image sensor performance, such as degradation of spatial resolution, reduction of overall optical sensitivity, and poor color separation. Therefore, the light-blocking structures 180-182 are implemented between neighboring pixels, so that light that would have incorrectly traveled to an adjacent pixel will be blocked and/or reflected back by the light-blocking structures 180-182, thereby reducing cross-talk. As discussed above, the light-blocking structures 180-182 are formed to have a thickness range (i.e., the thickness of the light-blocking layer 170) of 500 angstroms to about 5000 angstroms, so that the light-blocking structures 180-182 can block light effectively.

The light-blocking structure 183 is formed in the periphery region 54. The light-blocking structures 183 may substantially block light from reaching the digital device 60 or the reference pixel 61 that are supposed to be kept optically dark. No light-blocking structures are formed in the bonding pad region 56, since the bonding pad region 56 will be "opened" subsequently to define a bonding pad.

It can be seen that the light-blocking structures 180-183 and the layer 150 therebelow collectively define a plurality of openings (or trenches) 190-192. These openings 190-192 are reserved for the formation of a color filter array. In other words, a plurality of color filters will be formed to fill the openings 190-192, respectively (as discussed below in more detail with reference to FIG. 15). Since the light-blocking structures 180-182 are vertically aligned with the gaps 45-47, the openings 190-192 are vertically aligned with the pixels 40-42, respectively. As such, the color filters to be formed in the openings 190-192 would be aligned with the pixels 40-42, respectively.

Figure 8:
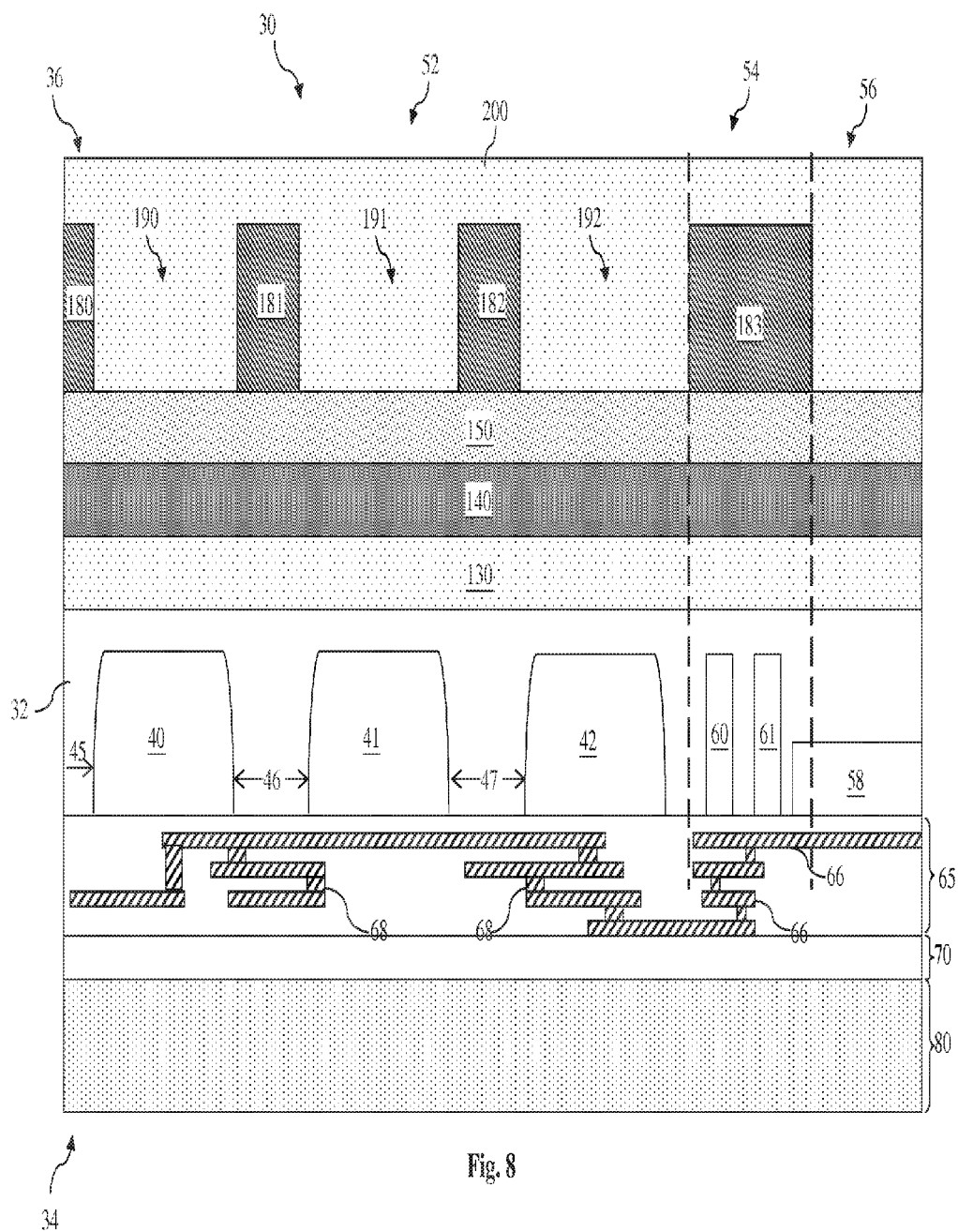

Referring now to FIG. 8, a capping layer 200 is formed over the layer 150 and over the light-blocking structures 180-183 on the back side 36. The capping layer 200 may be formed via one or more suitable deposition processes known in the art. One or more polishing processes may also be performed to ensure that the capping layer 200 has a flat or planarized surface. A material composition for the capping layer 200 is selected such that a high etching selectivity exists between the capping layer and the layer 150. In other words, the capping layer 200 and the layer 150 have substantially different etching rates, such that the etching process may be performed to remove one of the layers 200 and 150 without affecting the other. In some embodiments, the capping layer 200 contains a dielectric material that is the same as (or substantially similar to) the buffer layer 140. For example, the capping layer 200 and the buffer layer 140 may each contain silicon oxide.

Figure 9:
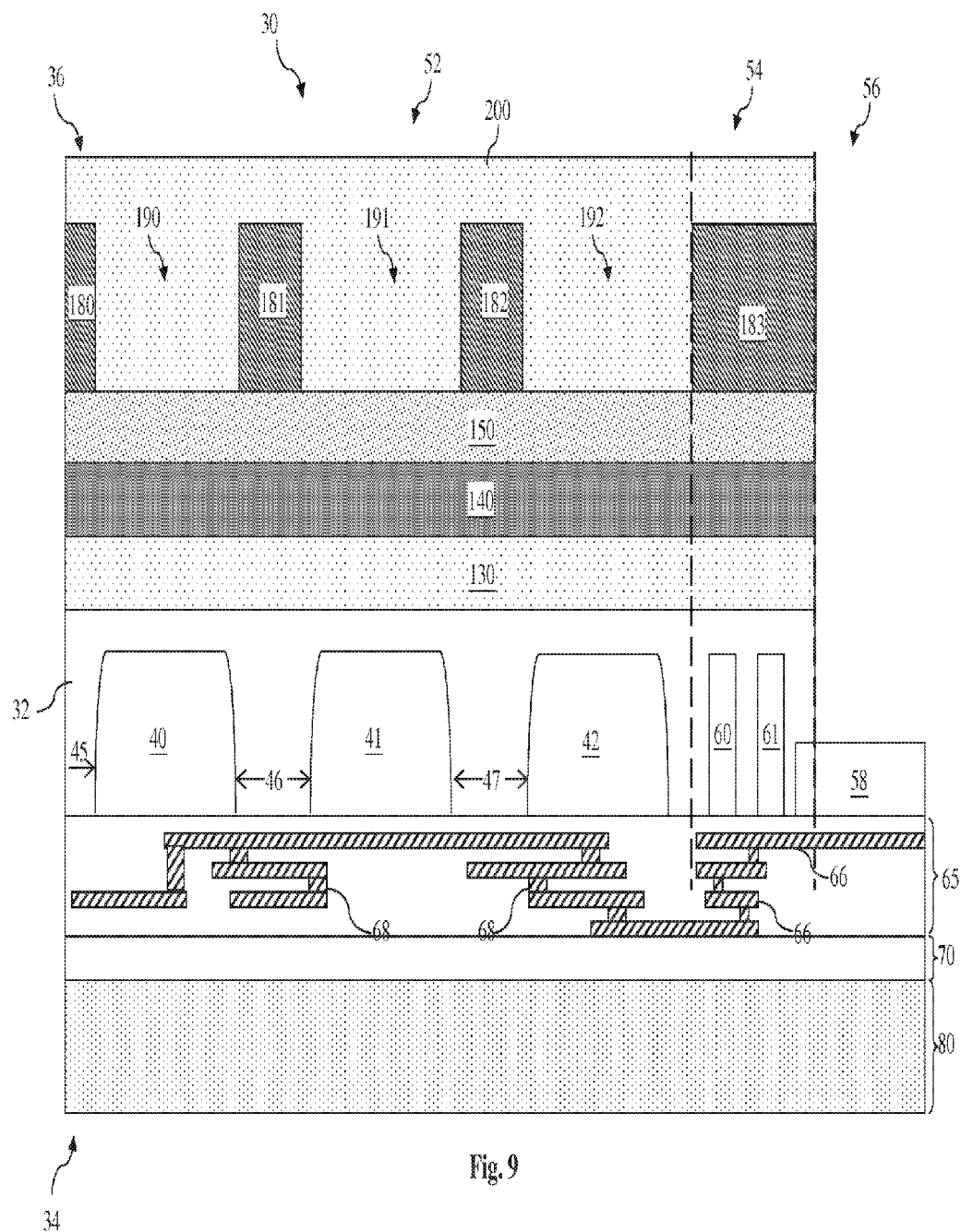

Referring now to FIG. 9, the bonding pad region 56 is "opened." In more detail, one or more etching processes may be performed to remove portions of the capping layer 200, the layer 150, the buffer layer 140, the ARC layer 130, and the substrate 32 in the bonding pad region 56, until the STI 58 is exposed. Meanwhile, the pixel region 52 and the periphery region 54 remain substantially un-etched.

Figure 10:
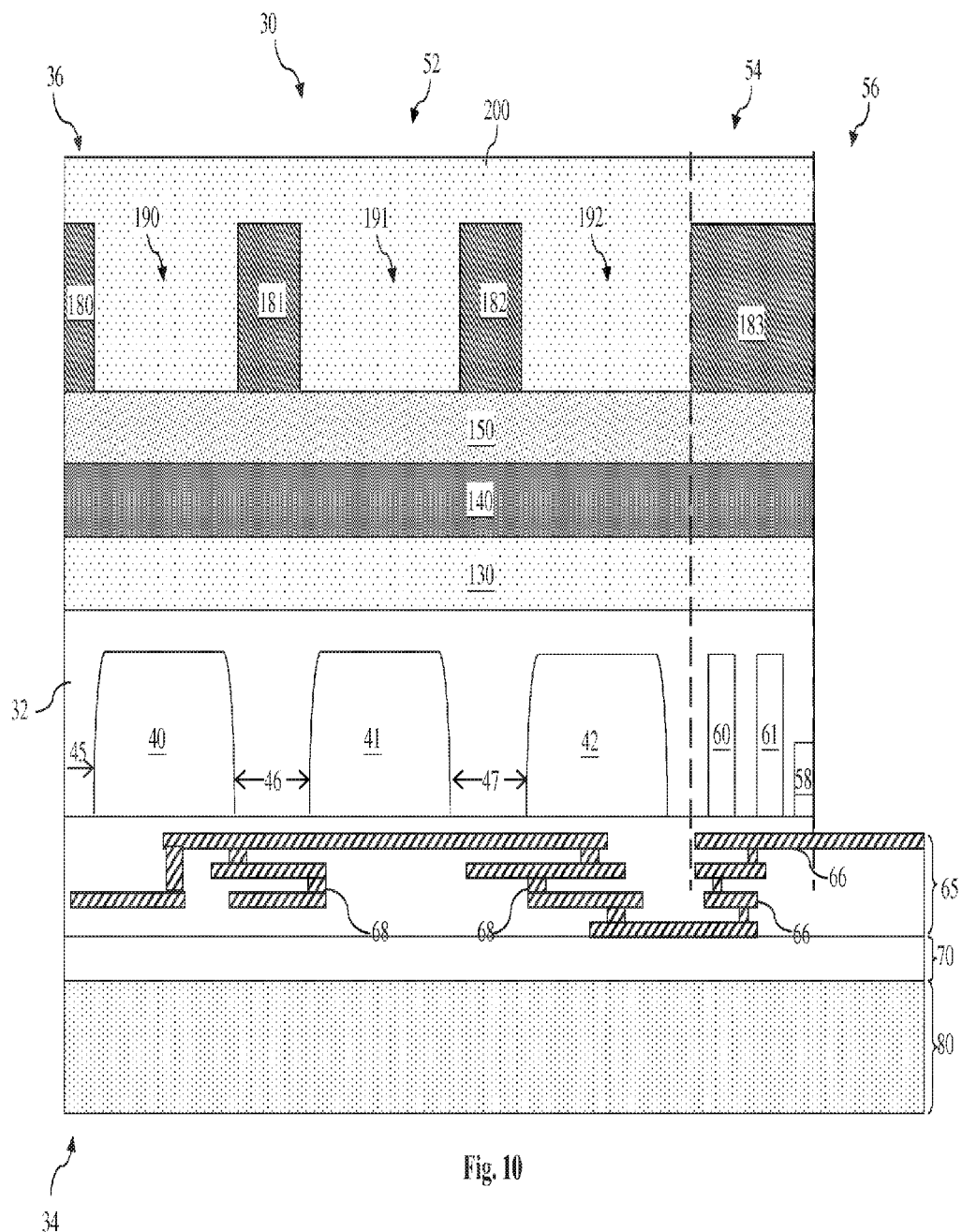

Referring now to FIG. 10, the STI 58 in the bonding pad region 56 is removed, for example by one or more etching processes. However, a portion of the STI 58 still remains in the periphery region 54, since the periphery region 54 is not etched. A portion of the interlayer dielectric material is also removed in the bonding pad region 56, for example by one or more etching processes. The removal of the STI 58 and the removal of the interlayer dielectric material in the bonding pad region 56 allows one of the conductive lines 66 to be exposed in the bonding pad region 56.

Figure 11:
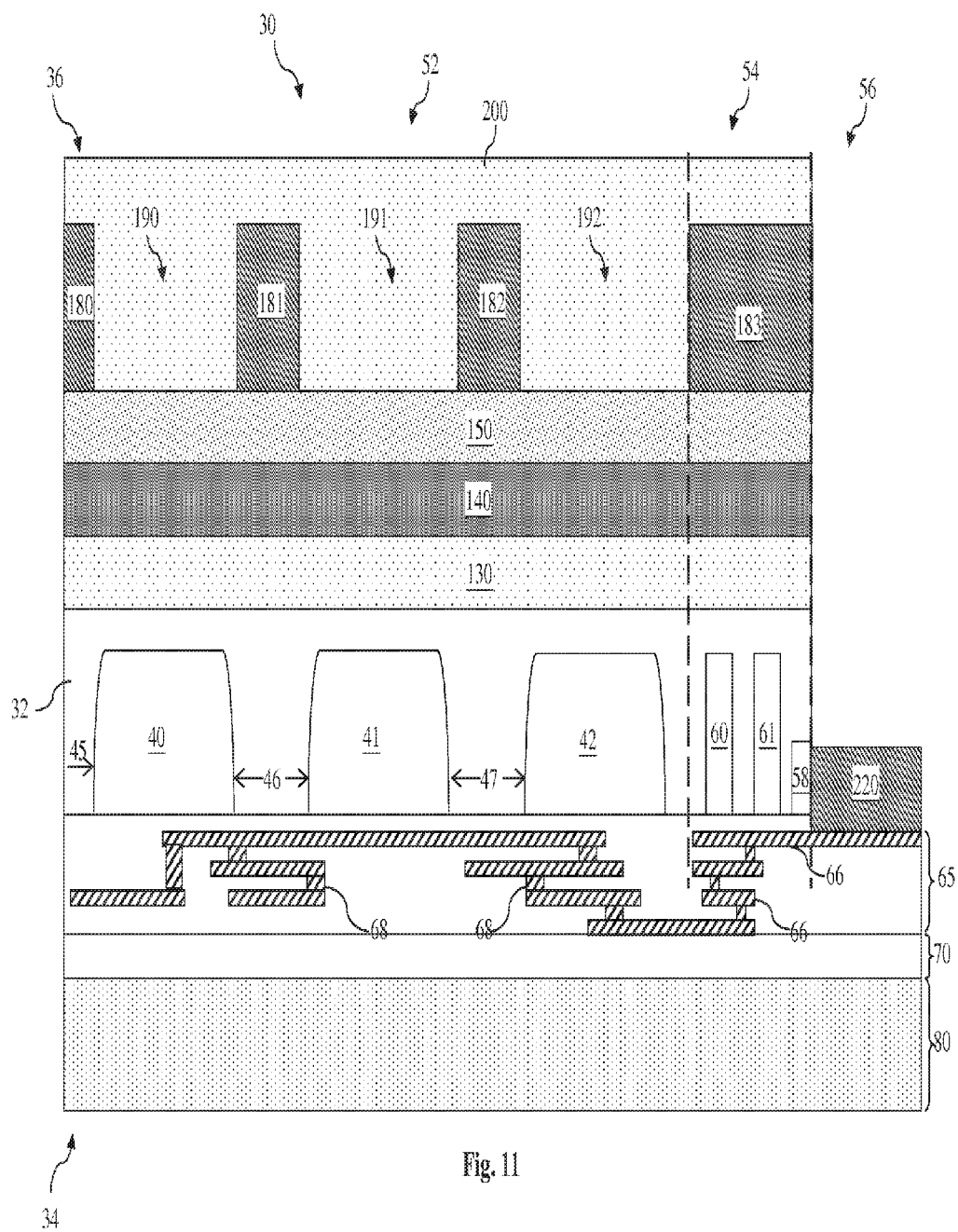

Referring now to FIG. 11, a conductive pad 220 is formed on the exposed surface of the conductive line 66 in the bonding pad region 56. The conductive pad 220 may be formed by one or more deposition and patterning processes. In some embodiments, the conductive pad 220 contains aluminum. In other embodiments, the conductive pad 220 may contain another suitable metal, for example copper. A bonding wire (or another electrical interconnection element) may be attached to the conductive pad 220 in a later process, and accordingly the conductive pad 220 may also be referred to as a bond pad or a bonding pad. Also, since the conductive pad 220 is formed on the conductive line 66, it is electrically coupled to the conductive line 66 and the rest of the interconnect structure 65 through the conductive line 66. In other words, electrical connections may be established between external device and the image sensor device 30 at least in part through the conductive pad 220.

It is understood that the conductive pad 220 may be formed to be thicker or thinner than the STI 58. In addition, the conductive pad 220 need not necessarily cover the entire bonding pad region 56, and therefore the conductive pad 220 may be formed to be spaced apart from the STI 58 (i.e., away from the periphery region 54).

Figure 12:
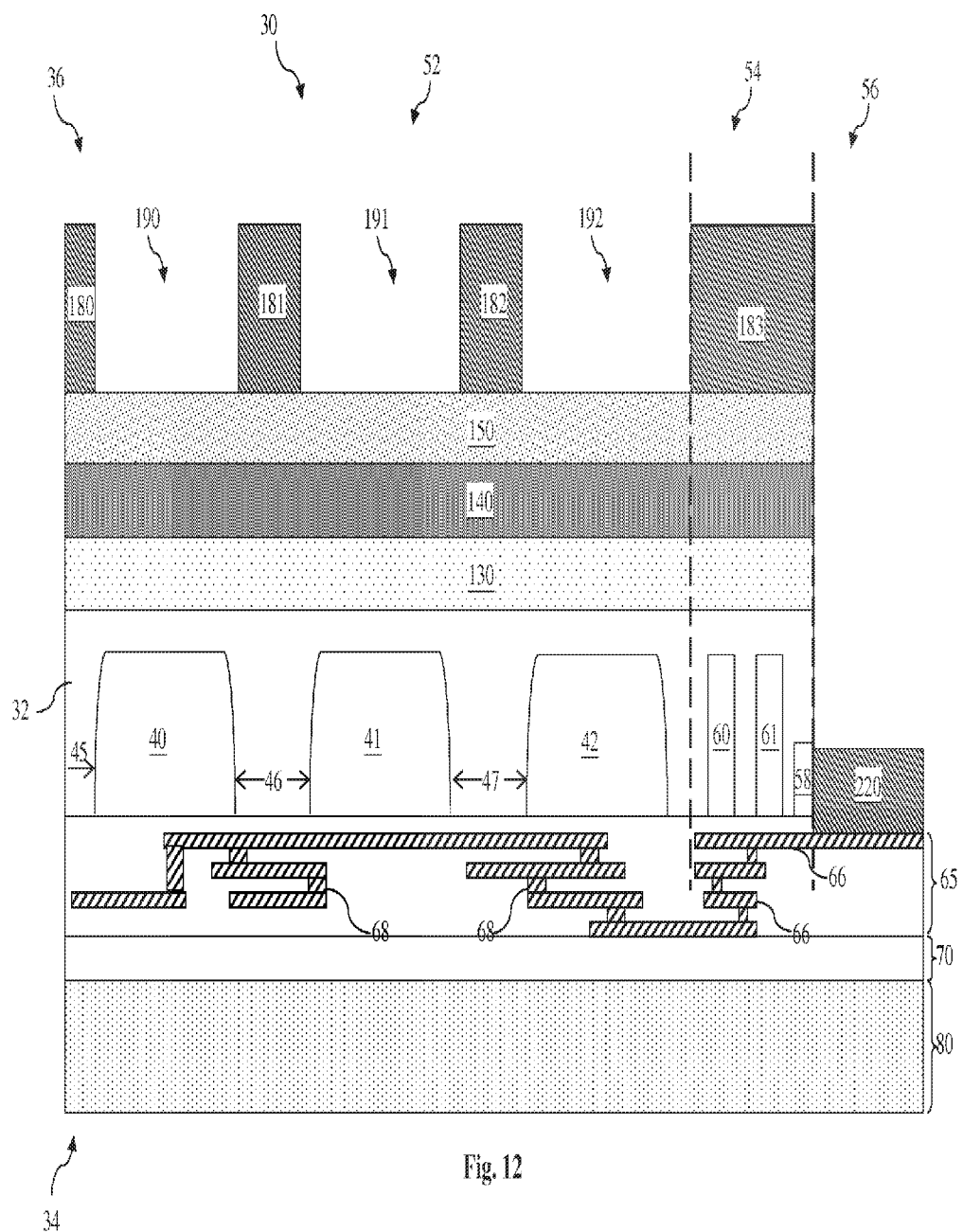

Referring now to FIG. 12, the capping layer 200 is removed, for example through one or more suitable etching processes. The layer 150 serves as an etching-stop layer during the removal of the capping layer 200. The etching processes involved in removing the capping layer 200 are configured such that a high etching selectivity exists between the capping layer 200 and the layer 150. For example, the etching rate for the capping layer 200 is substantially greater (e.g., by factors of 10) than the etching rate for the layer 150, such that the capping layer 200 may be removed while causing a negligible impact on the layer 150. Thus, the etching process "stops" at the layer 150, and portions of the layer 150 become exposed (by the openings 190-192) after the removal of the capping layer 200.

Had the layer 150 not been formed, the removal of the capping layer 200 may have caused substantial portions of the buffer layer 140 to be removed as well, since the buffer layer 140 and the capping layer 200 may have substantially similar material compositions (e.g., silicon oxide). This is undesirable, since the buffer layer 140 is in the optical path of incoming light, and the removal thereof may degrade the optical performance of the image sensor device 30. The present disclosure prevents the undesired etching of the buffer layer 150 with the implementation of the layer 150 as an etching-stop layer herein.

Figure 13:
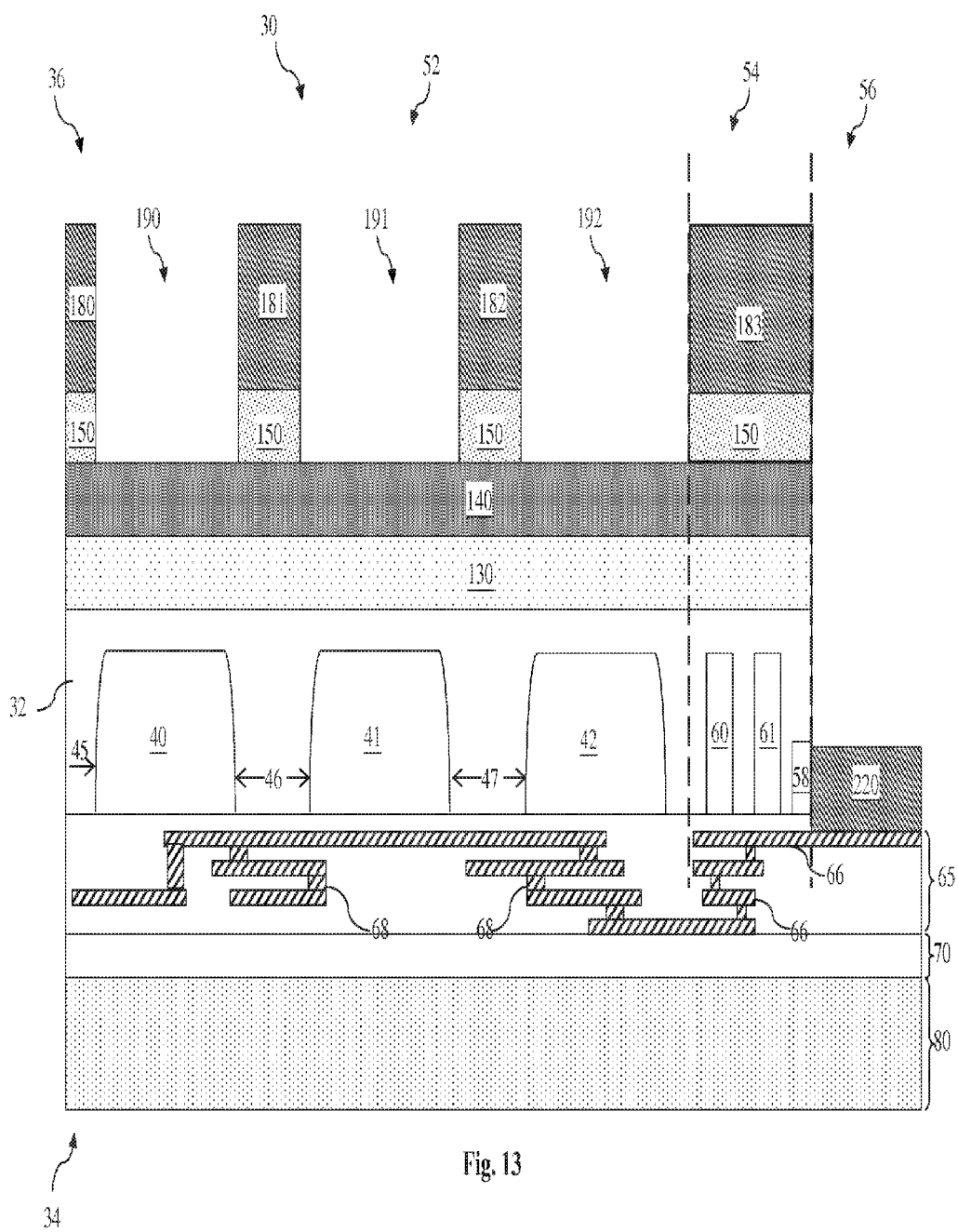

Referring now to FIG. 13, portions of the layer 150 exposed by the openings 190-192 are removed, for example through one or more etching processes known in the art. Again, the etching processes involved in etching the layer 150 are configured such that a high etching selectivity exists between the layer 150 and the buffer layer 140 therebelow. For example, the etching rate for the layer 150 is substantially greater (e.g., by factors of 10) than the etching rate for the buffer layer 140, such that the layer 150 may be removed while causing a negligible impact on the buffer layer 140. In other words, the layer 140 may serve as an etching-stop layer while the layer 150 is etched. Meanwhile, portions of the layer 150 disposed below the light-blocking structures 180-183 are kept intact, since they are protected by the light-blocking structures 180-183 during the etching of the layer 150. It is understood that the disposition of the portions of the layer 150 underneath the light-blocking structures 180-183 is one of the unique physical characteristics of the image sensor device 30 according to certain embodiments of the present disclosure.

One reason for the removal of the layer 150 within the trenches 190-192 is that color filters will be formed in the trenches 190-192, meaning light will be traveling through these trenches 190-192. The material of the layer 150 (e.g., SiN) may be opaque, or at least not as transparent as the buffer layer 140 therebelow. Therefore, if the layer 150 in the trenches 190-192 is not removed, it will interfere with the reception of light and degrade the optical performance of the image sensor device 30. On the other hand, the presence of the portions of the layer 150 below the light-blocking structures 180-183 does not substantially interfere with the optical performance of the image sensor device 30, as light should not propagate through these portions of the layer 150 anyway—i.e., light propagating through the layer 150 would have led to undesirable cross-talk between neighboring pixels.

Figure 14:
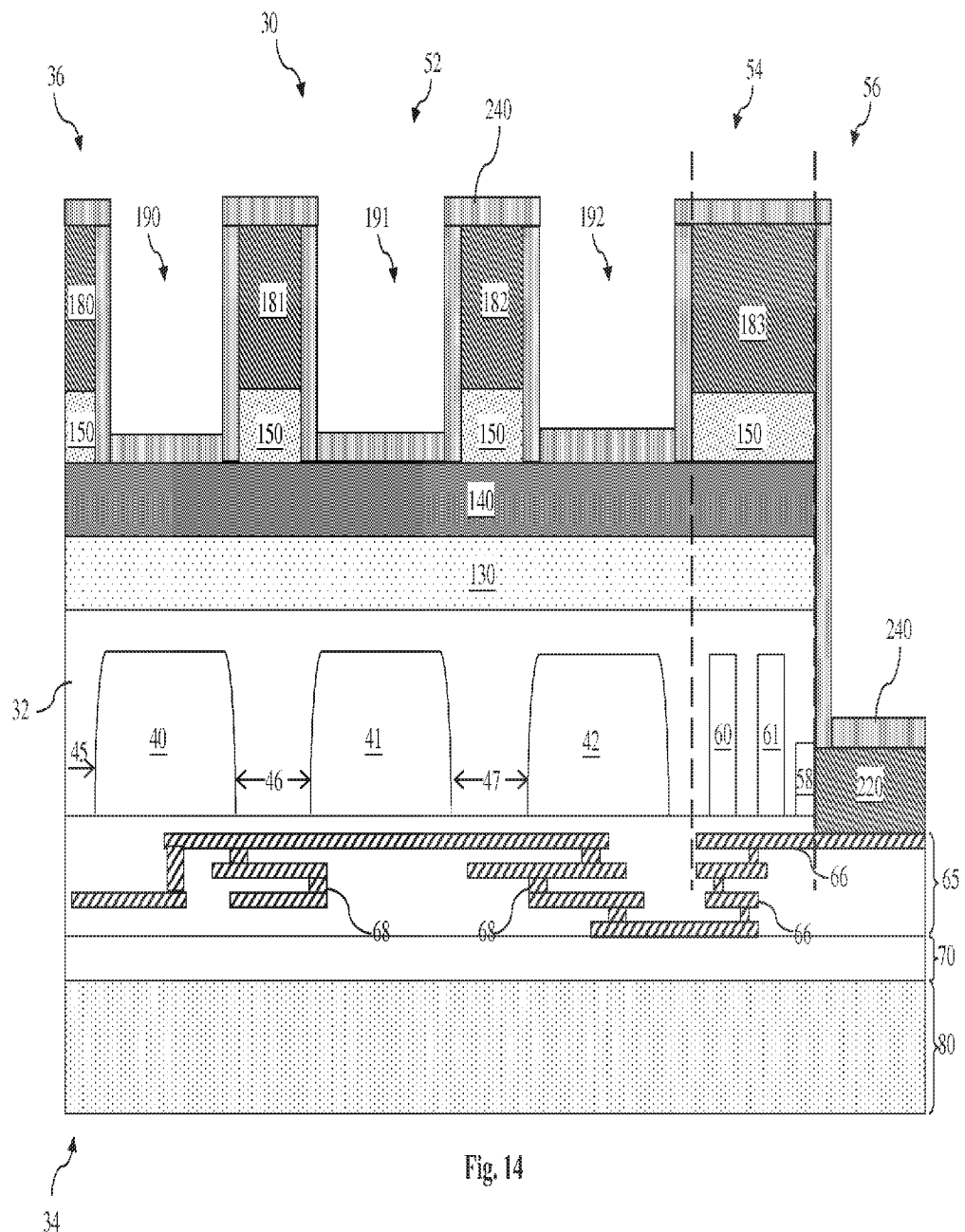

Referring now to FIG. 14, a passivation layer 240 is formed over the back side 36 of the image sensor device 30. The passivation layer 240 may be formed by a suitable deposition process known in the art. The passivation layer 240 is formed over the conductive pad 220 in the bonding pad region 56, on the sidewalls of the device substrate 32 and the layers 130-150 in the periphery region 54, and around each of the light-blocking structures 180-183 and on the exposed surfaces of the layers 140-150 in the pixel region 52. The passivation layer 240 protects the various layers therebelow from elements such as dust, moisture, etc. In some embodiments, the passivation layer 240 contains a dielectric material, such as silicon oxide, silicon nitride, silicon oxynitride, etc. In some embodiments, the passivation layer 240 is formed in a conformal manner.

Figure 15:
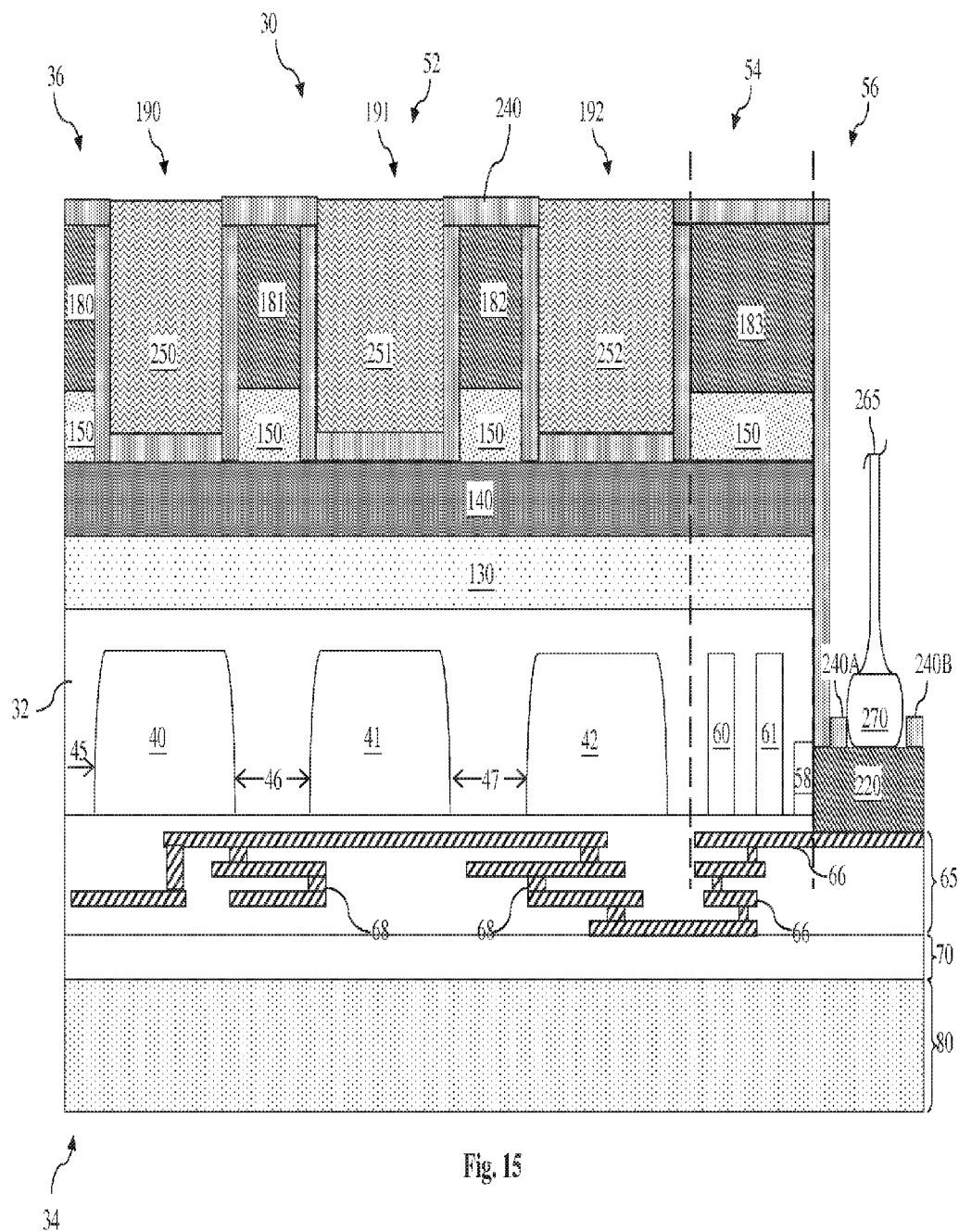

Referring now to FIG. 15, a portion of the passivation layer 240 in the bonding pad region 56 is removed, for example through one or more etching processes. The partial removal of the passivation layer 240 in the bonding pad region 56 exposes a portion of the conductive pad 220 in the bonding pad region 56. Note that the removal of the passivation layer 240 is performed in a manner such that portions of the passivation layer 240 (such as portions 240A and 240B) still remain on the conductive pad 220 in the bonding pad region 56 even after the portion of the passivation layer 240 has been removed. This is because there is no reason to completely remove the passivation layer 240 in the bonding pad region 56. For example, the removal of the passivation layer 240 (i.e., the "opening" of the passivation layer 240) merely needs to be performed to ensure that the exposed surface of the conductive pad 220 is sufficiently wide to receive a bonding wire. As such, it would have placed an unnecessarily high burden on the fabrication processes to completely remove the passivation layer 240 in the bonding pad region 56. In addition, complete removal of the passivation layer 240 in the bonding pad region 56 may also lead to the erosion or inadvertent removal of the passivation layer 240 where it is desired, such as on the sidewall surfaces of the device substrate 32, the layers 130-150, and on the light-blocking structure 183.

For these reasons discussed above, the portions 240A-240B of the passivation layer will remain on the conductive pad 220, and the presence of the portions 240A-240B of the passivation layer in the bonding pad region 56 is also one of the unique observable characteristics of the present disclosure. Stated differently, the disposition of the remnant portions 240A-240B of the passivation layer in the bonding pad region 56 is not necessarily intentional or deliberate, as these remnant portions 240A-240B of the passivation layer may or may not serve any specific functional or structural purposes. Rather, the presence of the remnant portions 240A-240B of the passivation layer is a byproduct of the unique fabrication process flow of the present disclosure.

A plurality of color filters 250-252 is also formed in the openings 190-192, respectively. In some embodiments, the color filters 250-252 may contain an organic material and may be formed by one or more coating and lithography processes. The color filters 250-252 may also be associated with different colors. For example, the color filter 250 may allow a red light to pass through but will filter out all the other colors of light, the color filter 251 may allow a green light to pass through but will filter out all the other colors of light, and the color filter 252 may allow a blue light to pass through but will filter out all the other colors of light.

The color filters 250-252 may be referred to as buried color filters (or a buried color filter array), since they are buried or embedded in the openings 190-192 defined by the light-blocking structures 180-183, rather than being formed over or above the light-blocking structures 180-183. In this manner, the color filters 250-252 are also vertically aligned with the pixels 40-42, respectively. In other words, the alignment between the color filters 250-252 and the pixels 40-42 is attributed at least in part to the fact that the light-blocking structures 180-182 are vertically aligned with the gaps 45-47 separating the neighboring pixels. As such, it may also be said that the color filters 250-252 are "self-aligned" with the pixels 40-42. Again, the self-aligned color filters 250-252 of the present disclosure improve the cross-talk performance of the image sensor device 30. Furthermore, the fact that the color filters 250-252 are now "buried" or "embedded" in the openings 190-192 also results in shorter optical paths between the color filters 250-252 and the pixels 40-42, which improves the reception of the light in the pixels 40-42.

A bonding wire 265 is also attached to the conductive pad 220 in the bonding pad region 56. The bonding wire 265 may be attached using a wire bonding process known in the art. The wire bonding process may include a ball bonding process, in which a portion of the bonding wire 265 is melted to form a bonding ball 270. In one embodiment, the bonding wire 265 and the bonding ball 270 each include gold. In other embodiments, the bonding wire 265 and the bonding ball 270 may include copper or another suitable metal. The bonding ball 270 has a lateral dimension that is smaller than a lateral dimension than the exposed surface of the conductive pad 220.

It is understood that the order of the opening of the passivation layer 240 in the bonding pad region 56, the attachment of the bonding wire 265, and the formation of the color filters 250-252 is not critical. For example, in some embodiments, the passivation layer 240 is first "opened" in the bonding pad region 56 to expose the conductive pad 220, and then the color filters 250-252 are formed. In other embodiments, the color filters 250-252 may be formed first, and the passivation layer 240 may then be "opened" in the bonding pad region 56 to expose the conductive pad 220 for the attachment of the bonding wire 265.

FIGS. 1-15 illustrate a process flow for forming buried or embedded color filters for a back-side illuminated image sensor according to some embodiments of the present disclosure. FIGS. 16-26 illustrate another process flow for forming buried or embedded color filters for a back-side illuminated image sensor according to some alternative embodiments of the present disclosure, as discussed in detail below. For reasons of consistency and clarity, similar components appearing in FIGS. 16-26 will be labeled the same.

Figure 16:
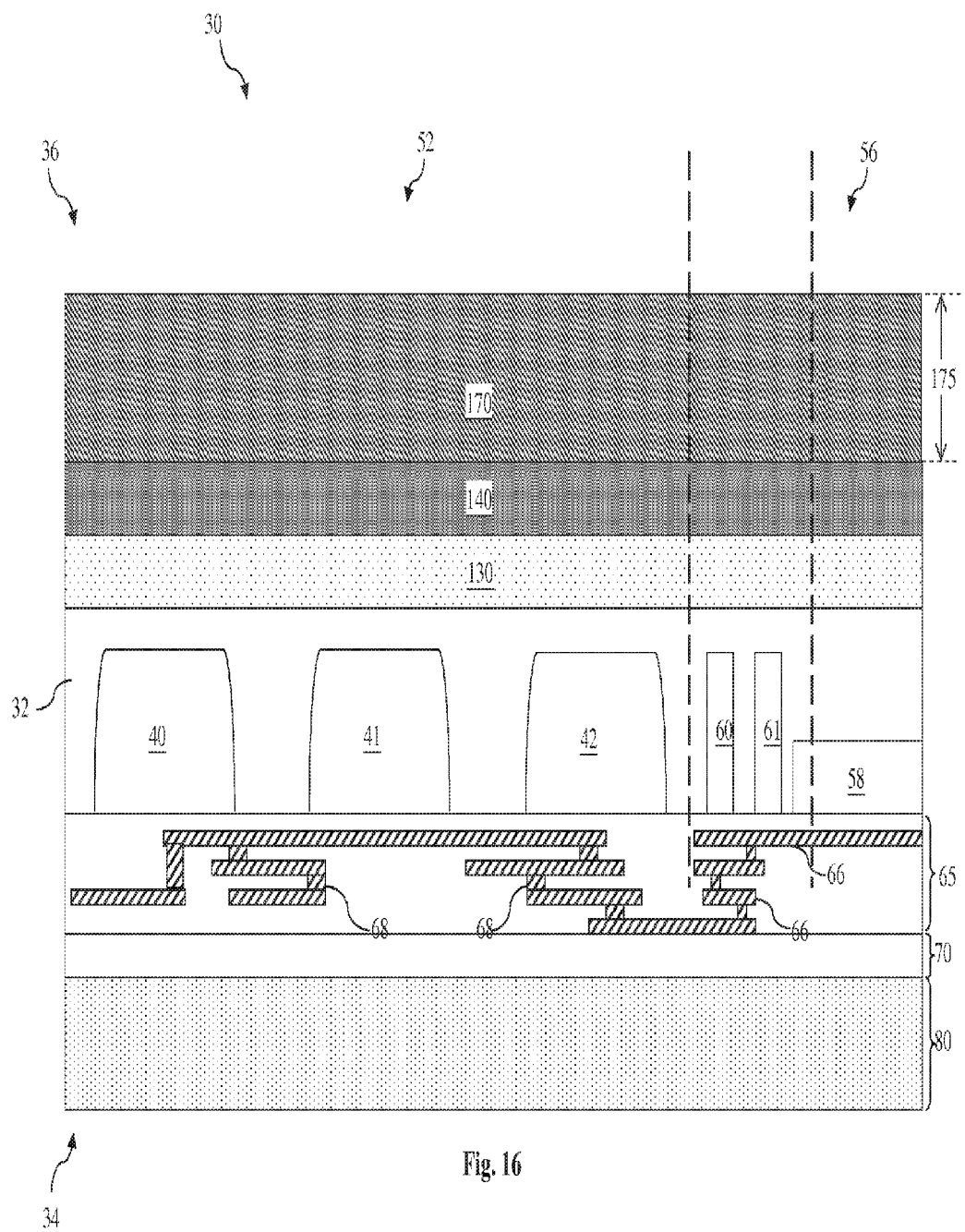

Referring to FIG. 16, the alternative fabrication process flow is carried out in the same manner as the process flow described above with reference to FIGS. 1-6, up to the point before the layer 150 is formed. In other words, the images sensor device 30 has undergone the formation of the pixels 40-42, the interconnect structure 65, bonding with the carrier substrate 80, thinning of the back side 36, and the formation of the ARC layer 130 and the buffer layer 140. However, rather than forming the layer 150, the alternative process flow bypasses this step, and forms the light-blocking layer 170 over the buffer layer 140 on the back side 36.

Figure 17:
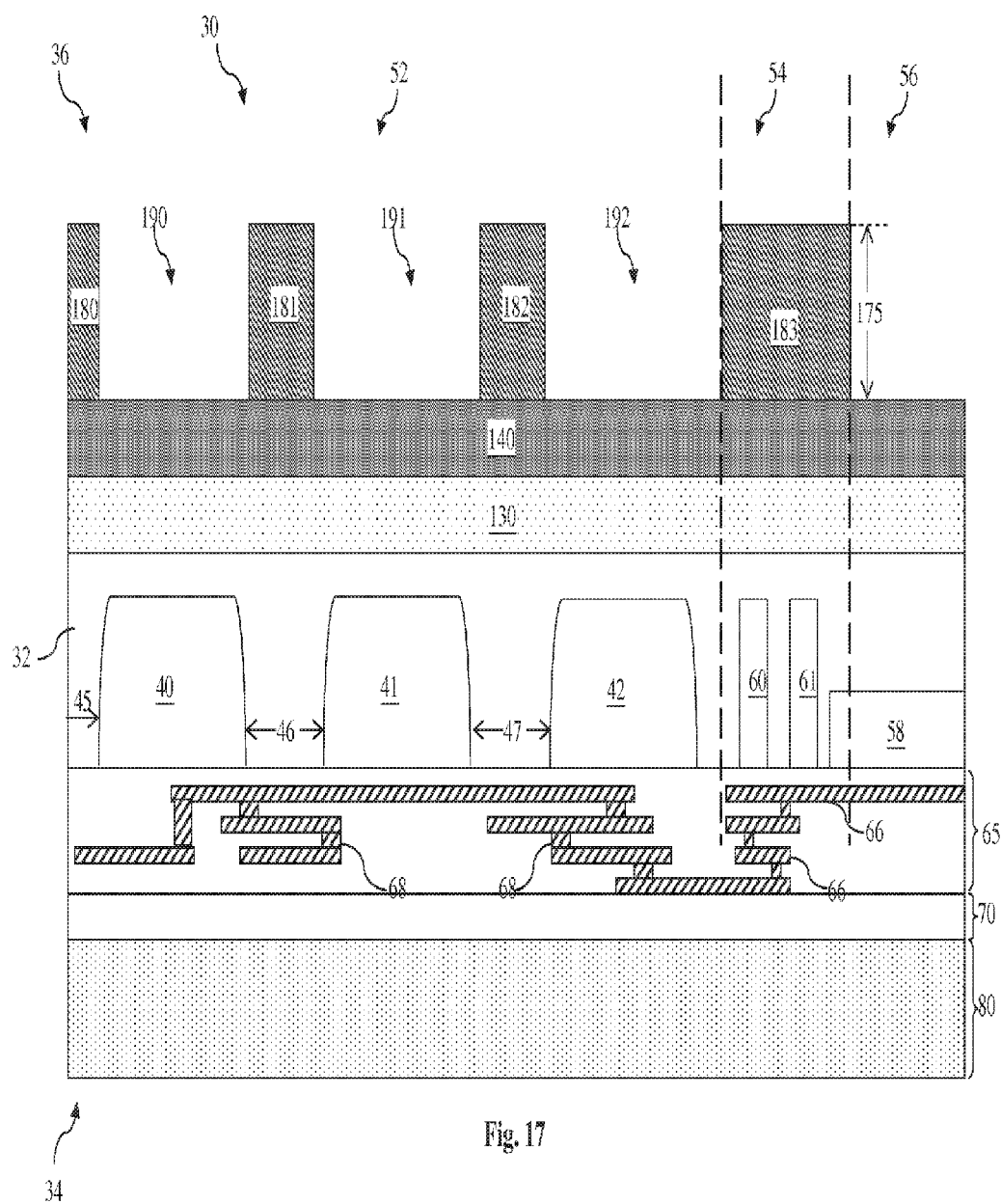

Referring now to FIG. 17, the light-blocking layer 170 is patterned into the plurality of light-blocking structures 180-183. The light-blocking structures 180-183 and the buffer layer 140 collectively define the plurality of openings 190-192. Again, the light-blocking structures 180-182 are vertically aligned with the gaps 45-47 separating the pixels 40-42, respectively, and the openings 190-192 are vertically aligned with the pixels 40-42, respectively.

Figure 18:
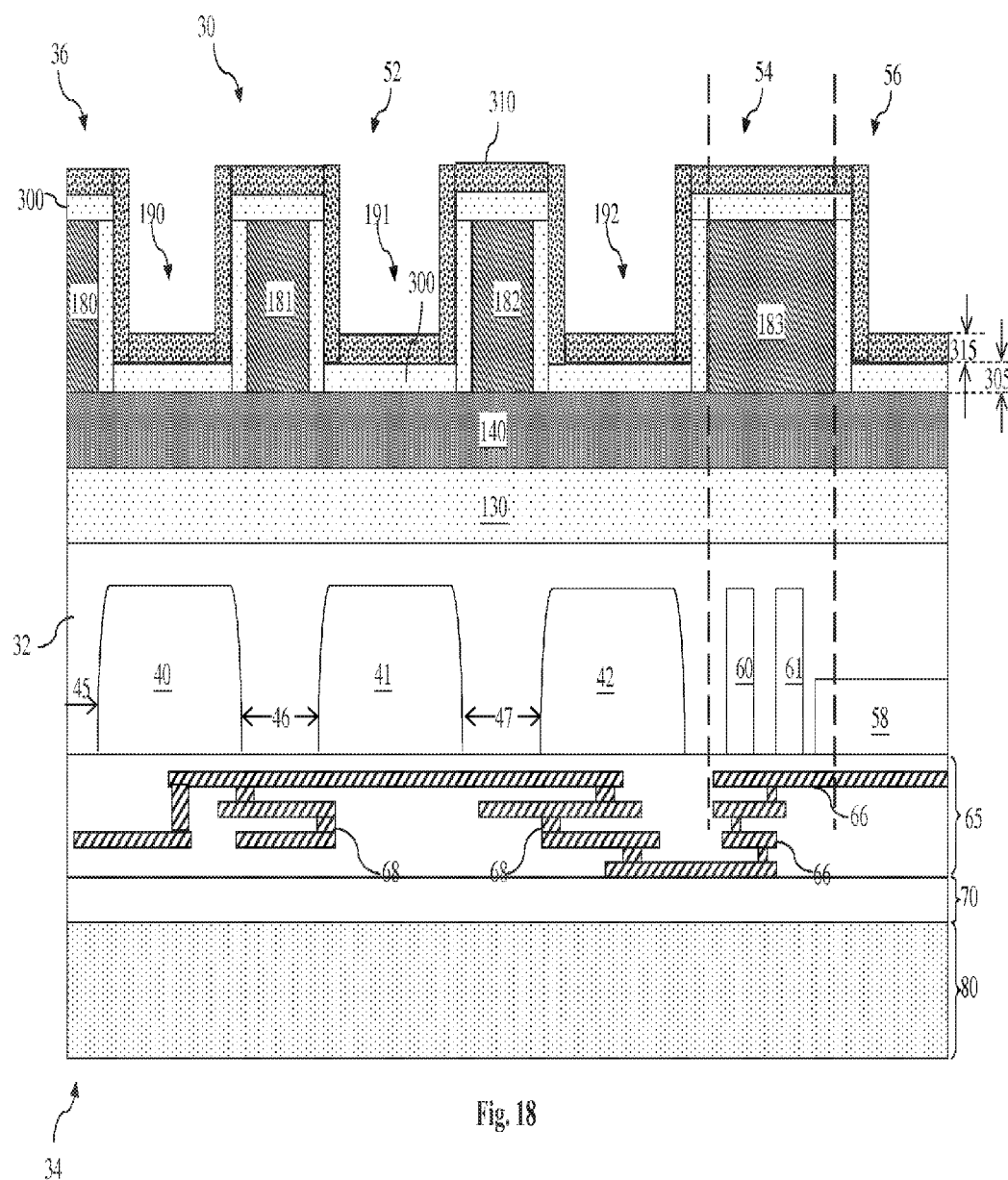

Referring now to FIG. 18, a dielectric layer 300 is formed over the light-blocking structures 180-183 and over the buffer layer 140 on the back side 36. The dielectric layer 300 protects the various layers therebelow (and the light-blocking structures 180-182) from elements such as dust, moisture, etc. Therefore, the dielectric layer 300 may also be referred to as a passivation layer. In some embodiments, the dielectric 300 contains silicon oxide. In some embodiments, the dielectric layer 300 is formed in a conformal manner. That is, the dielectric layer 300 has a thickness 305 is substantially uniform throughout. In some embodiments, the thickness 305 is in a range from about 50 angstroms to about 500 angstroms Still referring to FIG. 18, a layer 310 is formed over the layer 310 on the back side 36. The layer 310 has a material composition that is different from the material composition of the dielectric layer 300. In some embodiments, the layer 310 contains silicon nitride. In alternative embodiments, the layer 310 may contain silicon carbide, silicon oxynitride, titanium nitride, or even a suitable metal or metal compound material such as tungsten, aluminum copper, copper, etc. The material composition for the layer 310 is configured such that it (or the dielectric layer 300 below) may function as an etching-stop layer in etching processes to be discussed later. For example, the material composition of the layer 310 is selected such that a sufficiently high etching selectivity may exist between the layers 300 and 310 (and between the layer 310 and the layer to be formed thereon). In other words, the layers 300 and 310 have substantially different etching rates, such that an etching process may be performed to remove one of the layers 300 and 310 without affecting the other.

In some embodiments, the layer 310 is formed in a conformal manner. That is, the layer 310 has a thickness 315 is substantially uniform throughout. In some embodiments, the thickness 315 is in a range from about 100 angstroms to about 1500 angstroms. This thickness range is configured such that the layer 310 may adequately perform its function as an etching-stop layer in subsequent processes, as discussed in more detail below.

Figure 19:
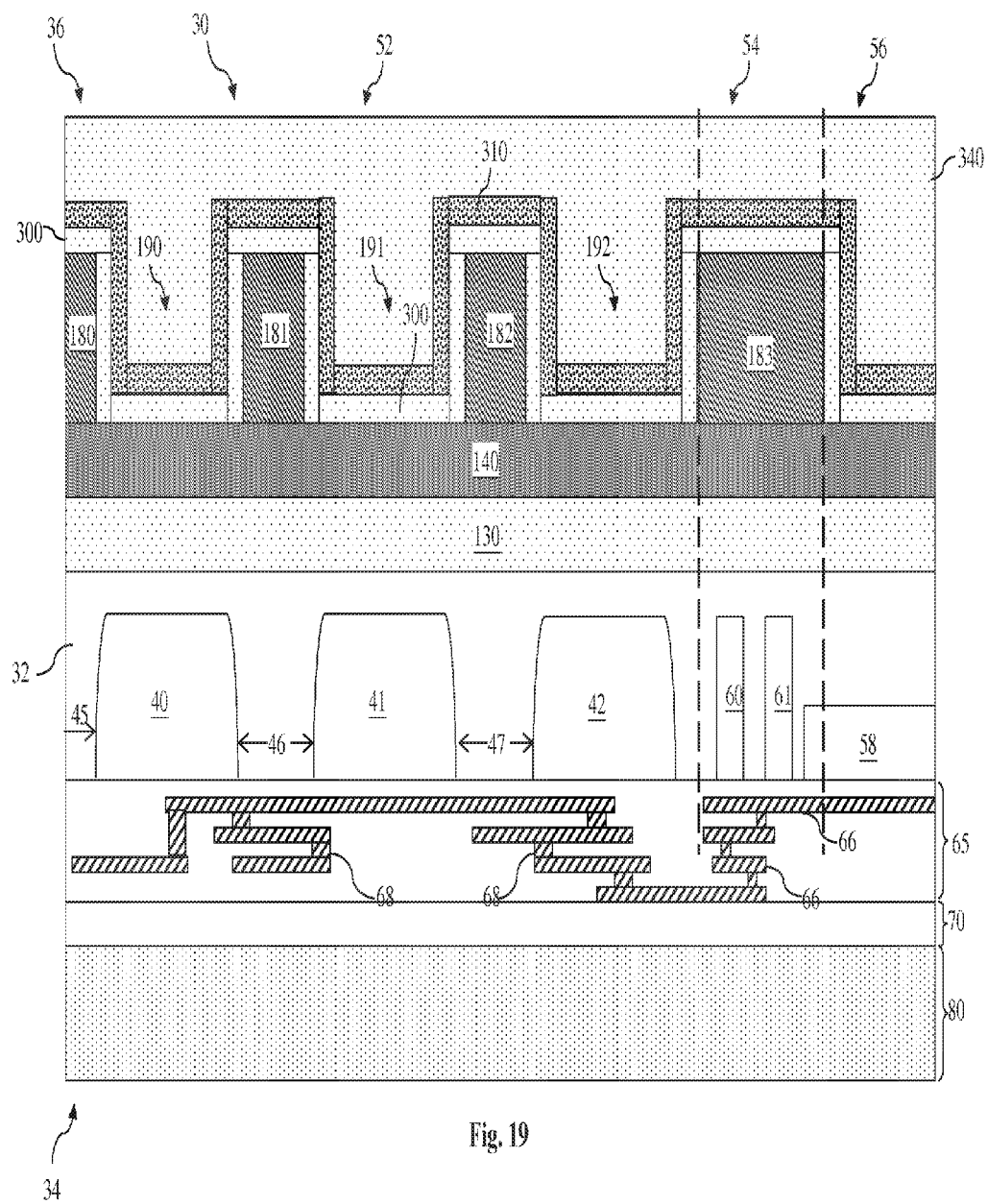

Referring now to FIG. 19, a capping layer 340 is formed over the layer 310 on the back side 36. The capping layer 340 may be formed by a deposition process known in the art. The capping layer 340 fills the openings 190-192. It is understood that a planarization process (e.g., a CMP process) may be performed to planarize the surface of the capping layer 340 after it has been deposited.

The material composition of the capping layer 340 is configured such that a sufficiently high etching selectivity may exist between the capping 340 and the layer 310. In other words, the layers 340 and 310 have substantially different etching rates, such that an etching process may be performed to remove one of the layers 340 and 310 without affecting the other. In this manner, the layer 310 may serve as an etching-stop layer when the capping layer 340 is being etched in a later process. In some embodiments, the capping layer contains silicon oxide. Therefore, in embodiments where the layers 300 and 340 each contain silicon oxide, and the layer 310 contains silicon nitride, it may be said that an ONO structure—oxide/nitride/oxide—is formed over the back side 36 of the substrate 32 and over the light-blocking structures 180-182.

Figure 20:
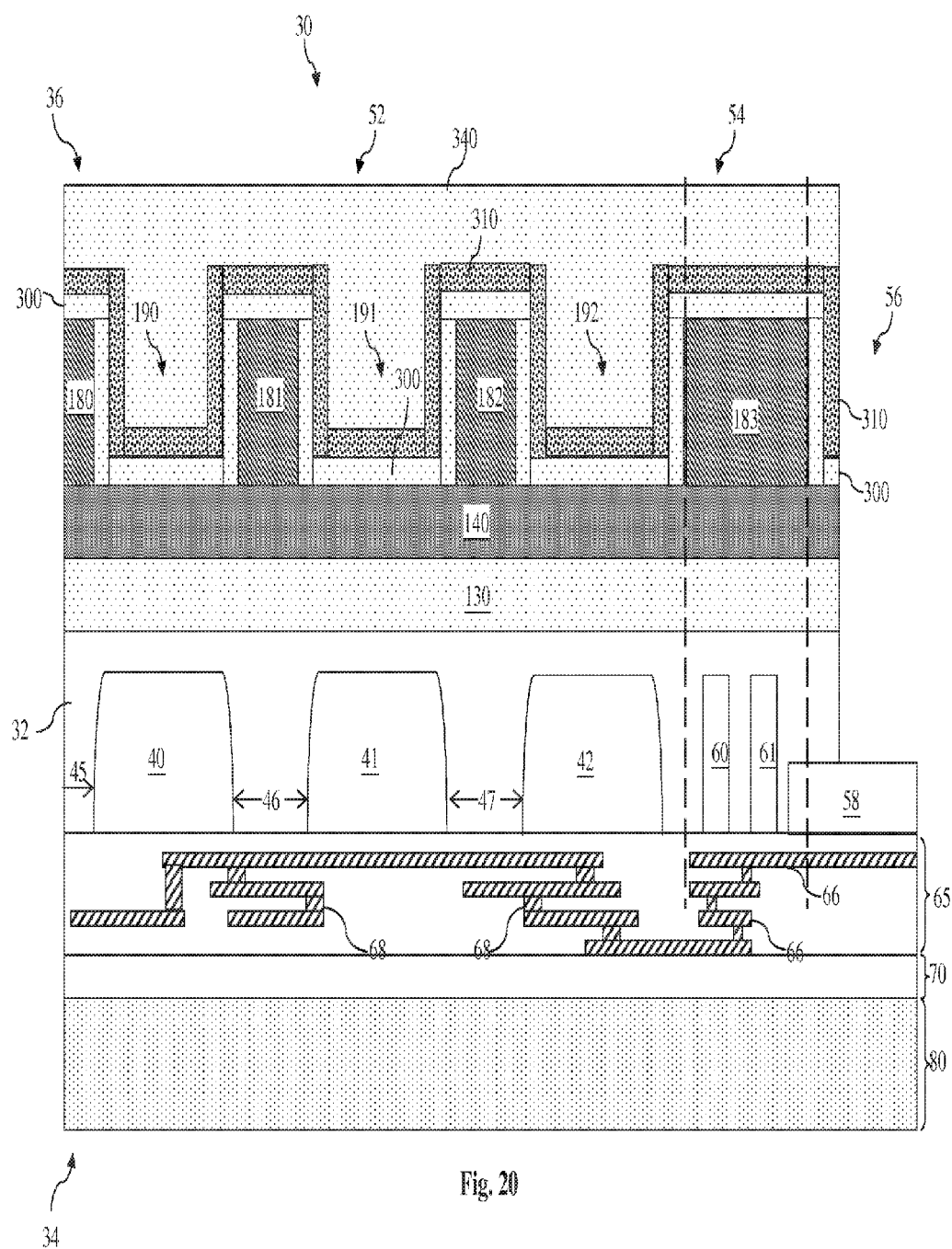

Referring now to FIG. 20, the bonding pad region 56 is "opened." In more detail, one or more etching processes may be performed to remove portions of the capping layer 340, the buffer layer 140, the ARC layer 130, and the substrate 32 in the bonding pad region 56, until a portion of the STI 58 is exposed. Meanwhile, the pixel region 52 and the periphery region 54 remain substantially un-etched. In addition, portions of the layers 300 and 310 disposed on the sidewall of the light-blocking structure 183 also remain substantially un-etched.

Figure 21:
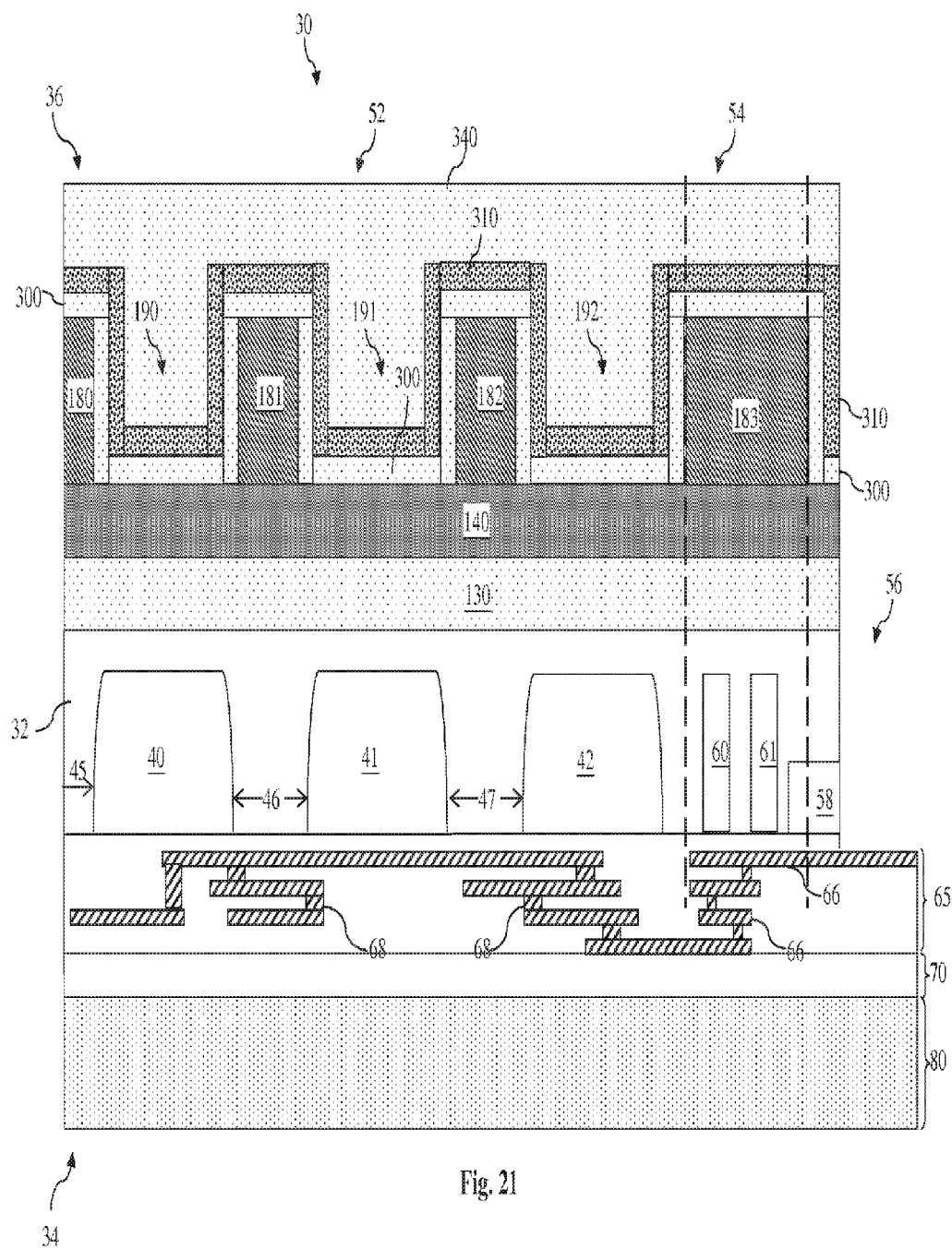

Referring now to FIG. 21, the exposed portion of the STI 58 in the bonding pad region 56 is removed, for example by one or more etching processes. However, a portion of the STI 58 still remains in the periphery region 54, since the periphery region 54 is not etched. A portion of the STI 58 disposed below the un-etched portions of the layers 300 and 310 in the bonding pad region 56 is also un-etched. A portion of the interlayer dielectric material is also removed in the bonding pad region 56, for example by one or more etching processes. The removal of the STI 58 and the removal of the interlayer dielectric material in the bonding pad region 56 allows one of the conductive lines 66 to be at least partially exposed in the bonding pad region 56.

Figure 22:
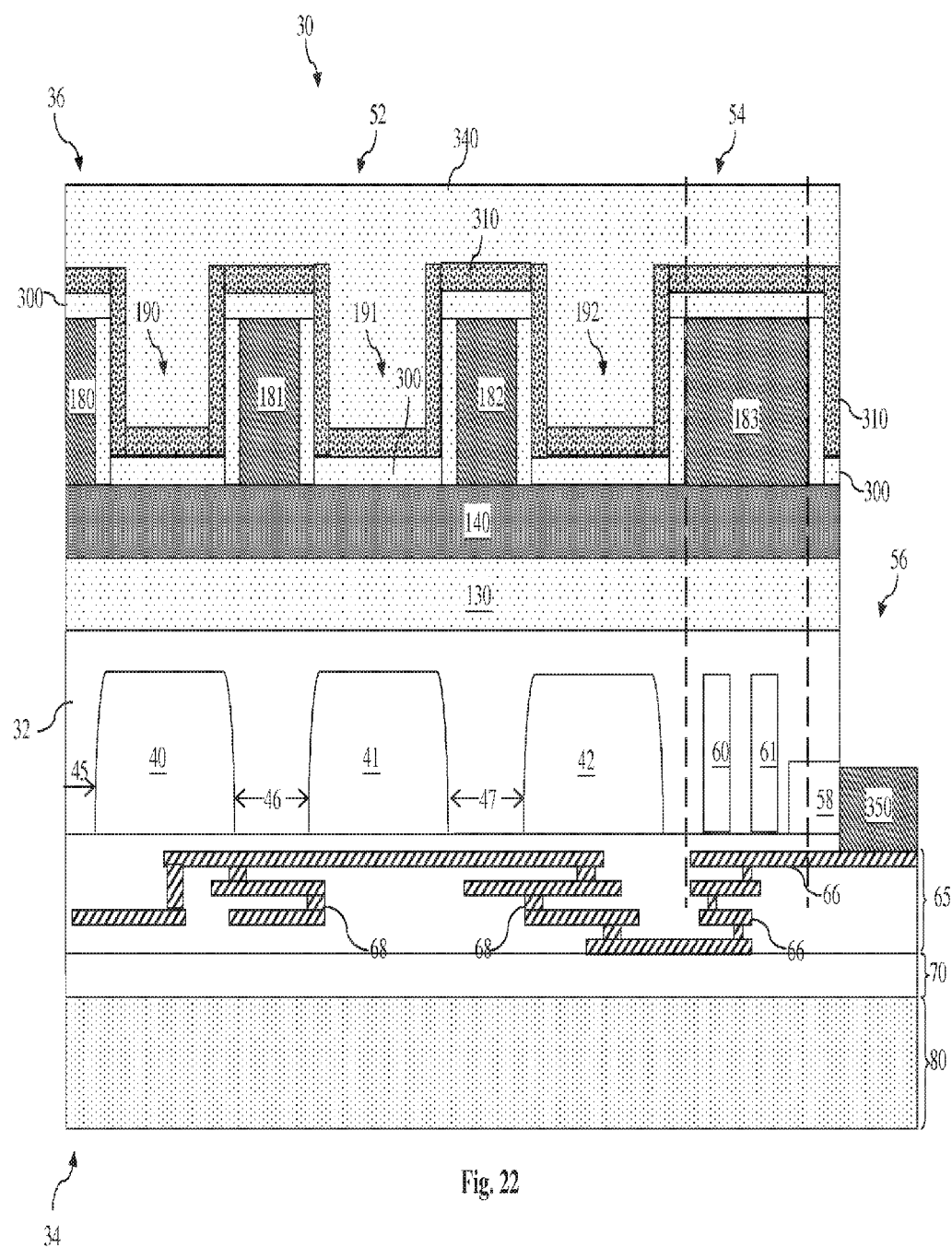

Referring now to FIG. 22, a conductive pad 350 is formed on the exposed surface of the exposed conductive line 66 in the bonding pad region 56. The conductive pad 350 may be formed by one or more deposition and patterning processes. In some embodiments, the conductive pad 350 contains aluminum. In other embodiments, the conductive pad 350 may contain another suitable metal, for example copper. A bonding wire (or another electrical interconnection element) may be attached to the conductive pad 350 in a later process, and accordingly the conductive pad 350 may also be referred to as a bond pad or a bonding pad. Also, since the conductive pad 220 is formed on the conductive line 66, it is electrically coupled to the conductive line 66 and the rest of the interconnect structure 65 through the conductive line 66. In other words, electrical connections may be established between external device and the image sensor device 30 at least in part through the conductive pad 350.

It is understood that the conductive pad 350 may be formed to be thicker or thinner than the STI 58. In addition, the conductive pad 350 need not necessarily cover the entire bonding pad region 56, and therefore the conductive pad 350 may be formed to be spaced apart from the STI 58 (i.e., away from the periphery region 54).

Figure 23:
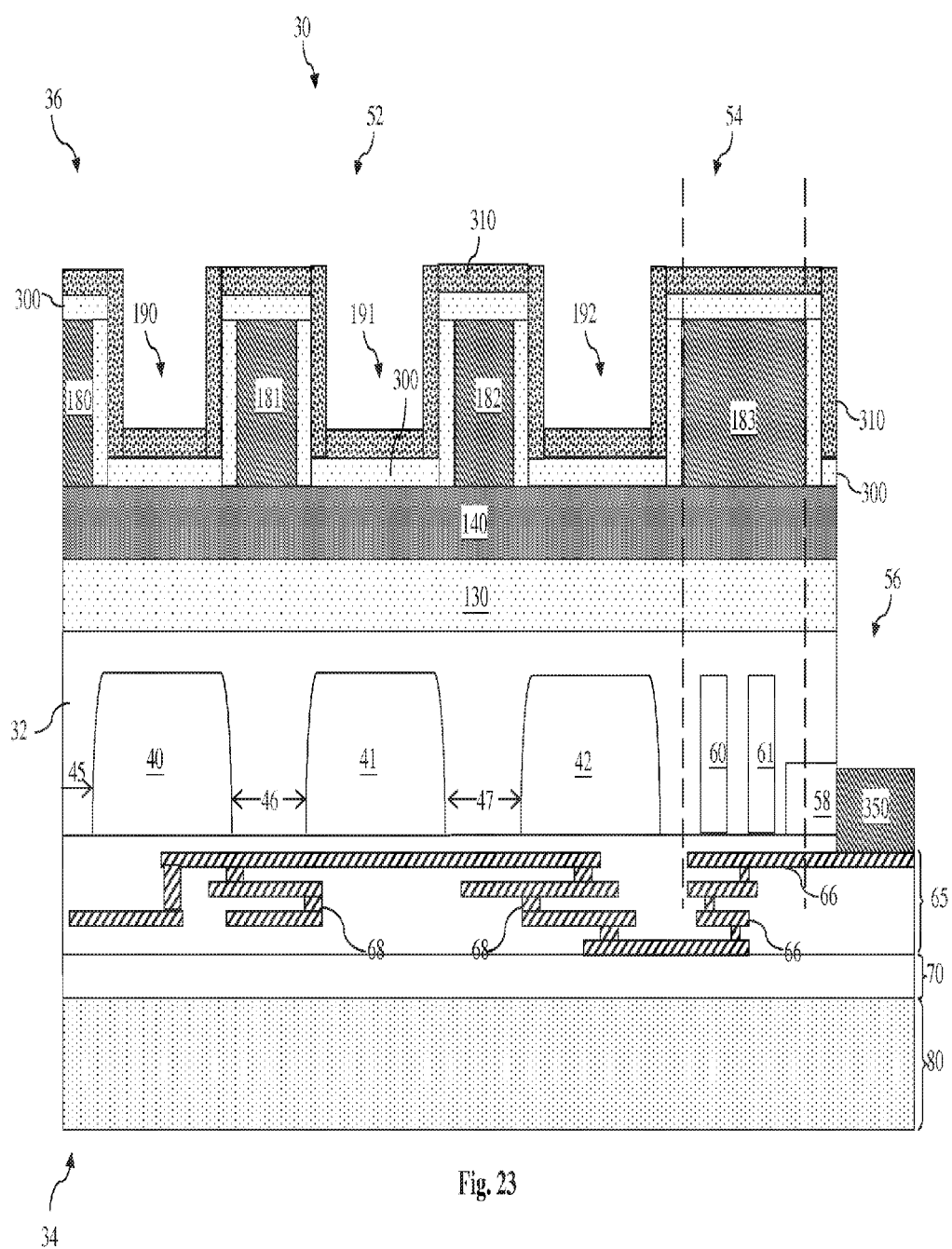

Referring now to FIG. 23, the capping layer 340 is removed, for example through one or more suitable etching processes. The layer 310 serves as an etching-stop layer during the removal of the capping layer 340. The etching processes involved in removing the capping layer 340 (as well as the material compositions of the layers 340 and 310) are configured such that a high etching selectivity exists between the capping layer 340 and the layer 310. For example, the etching rate for the capping layer 340 is substantially greater (e.g., by factors of 10) than the etching rate for the layer 310, such that the capping layer 340 may be removed while causing a negligible impact on the layer 310. Thus, the etching process "stops" at the layer 310, and the removal of the capping layer 340 exposes the layer 310.

Figure 24:
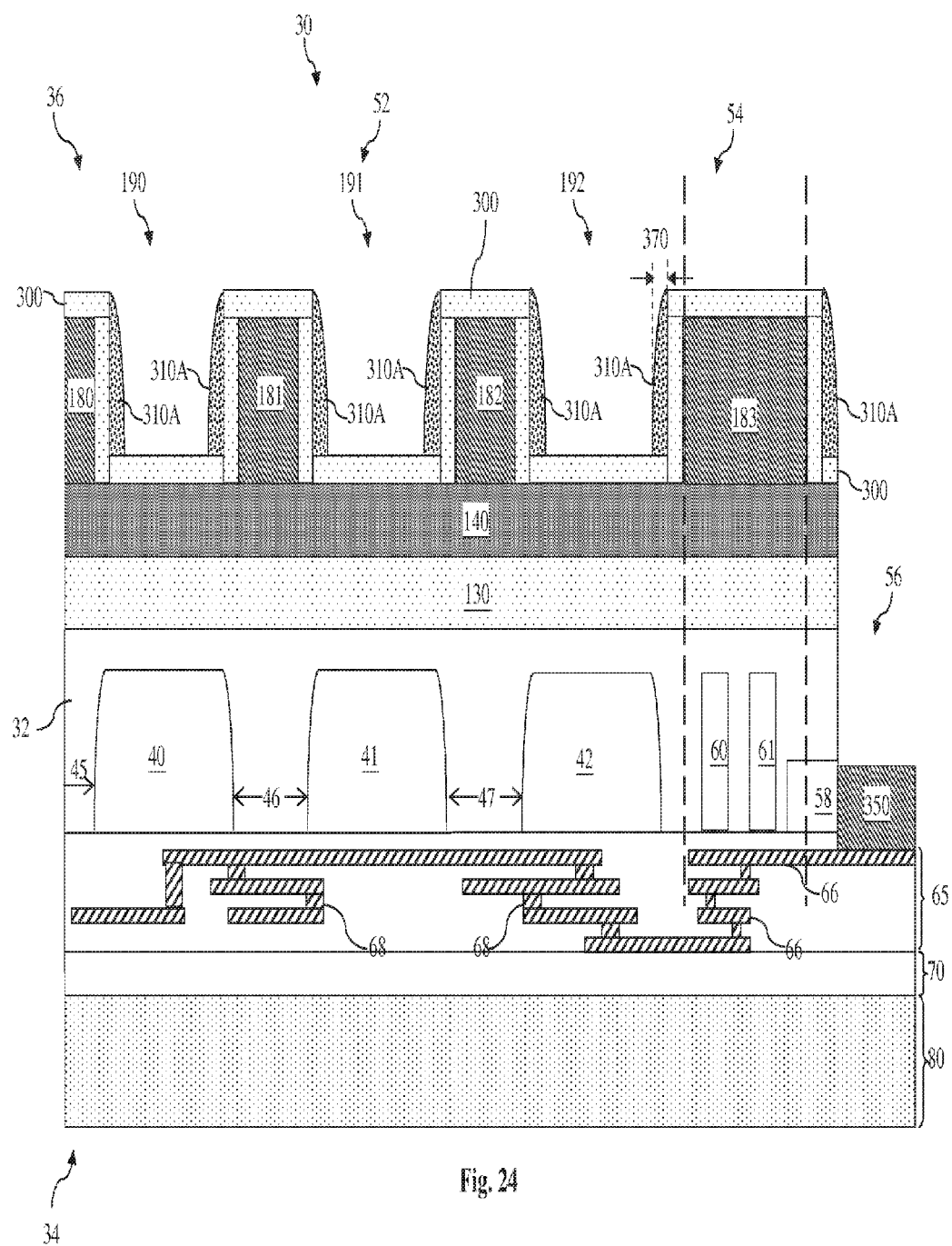

Referring now to FIG. 24, an etching process is performed to remove portions of the layer 310. In the embodiment illustrated in FIG. 24, the etching process is a dry etching process. As a result of the dry etching process, spacers 310A are formed. The spacers 310A are portions of the layer 310 that are not removed by the etching process (or stated differently, remaining portions of the layer 310 after the etching process is performed). The spacers 310A are disposed on portions of the dielectric layer 300 that are formed on the sidewall surfaces of the light-blocking structures 180-183. Thus, it may be said that the spacers 310A are disposed over the sidewalls of the light-blocking structures 180-183 as well. However, the spacers 310A are not disposed over top surfaces of the light-blocking structures 180-183, since the portions of the layer 310 disposed over the top surfaces of the light-blocking structures 180-183 have already been removed by the dry etching process. In some embodiments (for example when the spacers 310A contain silicon nitride or a metal), the spacers 310A are less transparent (or more opaque) than the layer 300. This may be beneficial as the opaque spacers 310A may aid the light-blocking structures 180-183 in blocking or reflecting light in order to reduce cross-talk.

The shape and profile of the spacers 310A resemble spacers that are typically formed on the sidewalls of a transistor gate in semiconductor fabrication. For example, the spacers 310A have somewhat curved outer surfaces (away from the light-blocking structures 180-183) and are narrower at the top and wider at the bottom. However, the material compositions of these spacers 310A may or may not be the same as the conventional spacers formed on the sidewalls of the transistor gates. The spacers 310A are formed to have a maximum lateral dimension 370. In some embodiments, the maximum lateral dimension 370 is approximately the same as the thickness 315 of the layer 310 (FIG. 18), which is in a range from about 100 angstroms to about 1500 angstroms. It is understood that the presence of the spacers 310A is one of the unique physical characteristics of the image sensor device 30 according to certain embodiments of the present disclosure.

As discussed above, a high etching selectivity exists between the layers 300 and 310. Therefore, the layer 300 serves as an etching-stop layer during the etching of the layer 310. In other words, the etching of the layer 310 does not substantially affect the layer 300. Thus, the high etching selectivity between the layers 300 and 310, as well as between the layers 310 and 340, ensures that the capping layer 340 can be effectively removed without damaging the buffer layer 140 (which is in the optical path) therebelow. In more detail, the ONO-like structure formed collectively by the layers 300, 310, and 340 allows the layer 310 to serve as an etching-stop layer while the capping layer 340 is removed, and it also allows the layer 300 to serve as an etching-stop layer while the layer 310 is removed. At the end of these etching processes, the buffer layer 140 is undamaged, and the passivation layer 300 is formed in the openings 190-192, which are reserved for the formation of color filters.

Figure 25:
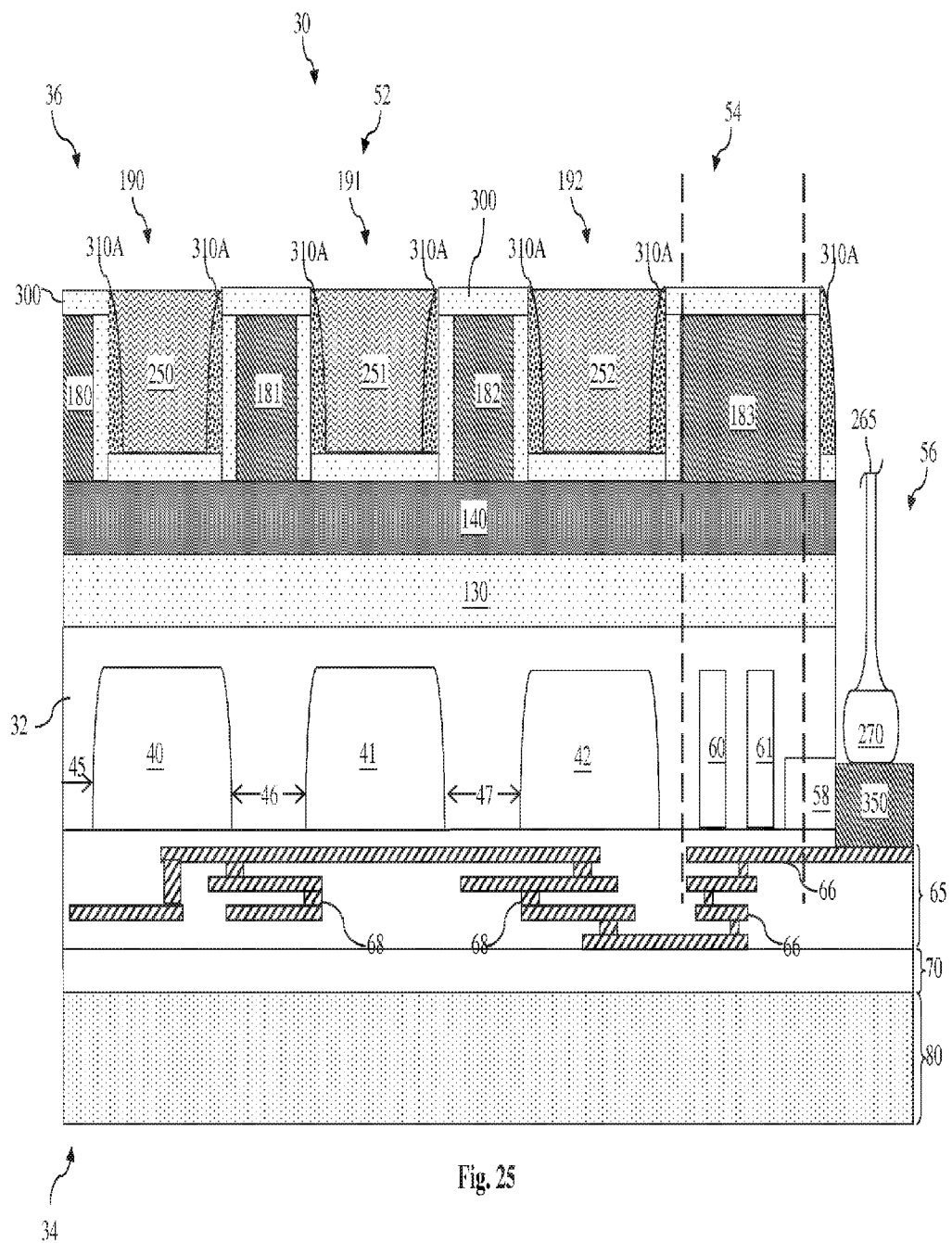

Referring now to FIG. 25, a plurality of color filters 250-252 is formed in the openings 190-192, respectively. In some embodiments, the color filters 250-252 may contain an organic material and may be formed by one or more coating and lithography processes. The color filters 250-252 may also be associated with different colors. For example, the color filter 250 may allow a red light to pass through but will filter out all the other colors of light, the color filter 251 may allow a green light to pass through but will filter out all the other colors of light, and the color filter 252 may allow a blue light to pass through but will filter out all the other colors of light.

The color filters 250-252 may be referred to as buried color filters (or a buried color filter array), since they are buried or embedded in the openings 190-192 defined by the light-blocking structures 180-183, rather than being formed over or above the light-blocking structures 180-183. In this manner, the color filters 250-252 are also vertically aligned with the pixels 40-42, respectively. In other words, the alignment between the color filters 250-252 and the pixels 40-42 is attributed at least in part to the fact that the light-blocking structures 180-182 are vertically aligned with the gaps 45-47 separating the neighboring pixels. As such, it may also be said that the color filters 250-252 are "self-aligned" with the pixels 40-42. Again, the self-aligned color filters 250-252 of the present disclosure improve the cross-talk performance of the image sensor device 30. Furthermore, the fact that the color filters 250-252 are now "buried" or "embedded" in the openings 190-192 also results in shorter optical paths between the color filters 250-252 and the pixels 40-42, which improves the reception of the light in the pixels 40-42.

A bonding wire 265 is also attached to the conductive pad 350 in the bonding pad region 56. Since the passivation layer (i.e., layer 300) in the bonding pad region 56 has already been removed, the conductive pad 350 is exposed and is ready to be bonded to the bonding wire 265. The bonding wire 265 may be attached using a wire bonding process known in the art. The wire bonding process may include a ball bonding process, in which a portion of the bonding wire 265 is melted to form a bonding ball 270. In one embodiment, the bonding wire 265 and the bonding ball 270 each include gold. In other embodiments, the bonding wire 265 and the bonding ball 270 may include copper or another suitable metal. The bonding ball 270 has a lateral dimension that is smaller than a lateral dimension than the exposed surface of the conductive pad 350.

It is understood that the order sequence of the formation of the color filters 250-252 and the attachment of the bonding wire 265 is not critical. For example, in some embodiments, the color filters 250-252 may be formed before the attachment of the bonding wire 265. In other embodiments, the bonding wire 265 may be attached before the formation of the color filters 250-252.

Figure 26:
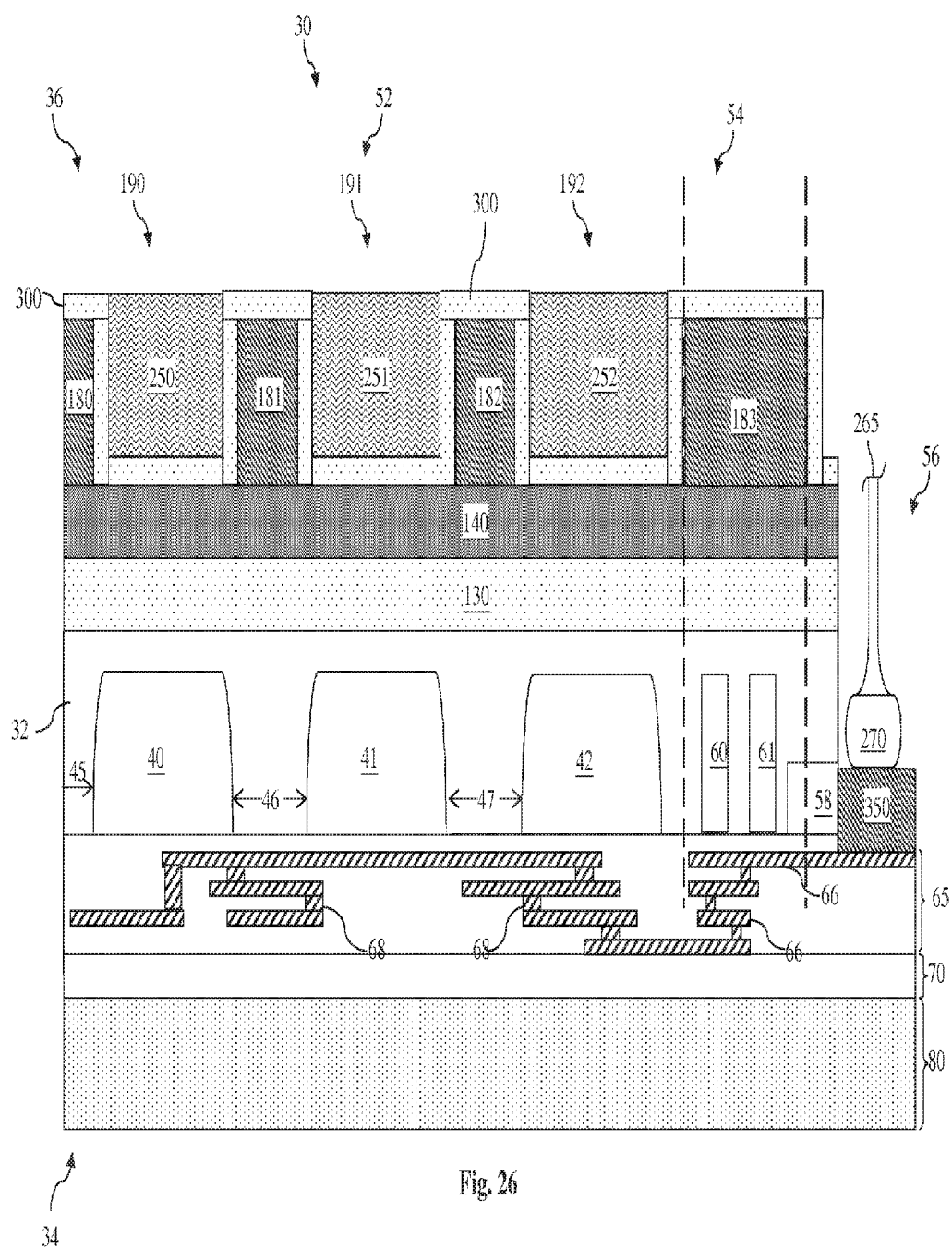

The embodiment discussed above uses a dry etching process to remove the layer 310, which leaves the spacers 310A on the sidewalls of the light-blocking structures 180-183. It is also understood that, in some alternative embodiments, a wet etching process may be performed to remove the layer 310 instead of the dry etching process. In that case, the layer 310 may be completely removed. In other words, no spacers 310A would have been formed if the wet etching process was used to remove the layer 310. The resulting image sensor device 30 associated with this wet etching process is shown in FIG. 26.

Although not specifically illustrated, it is understood that additional processes may be performed to complete the fabrication of the image sensor device 30. For example, a plurality of micro-lenses may be formed over the color filters 250-252. The micro-lenses help direct and focus light towards the pixels 40-42 in the substrate 32. The micro-lenses may be positioned in various arrangements and have various shapes depending on a refractive index of material used for the micro-lens and distance from a sensor surface. In addition, a plurality of testing, dicing, and packaging processes may also be performed. For reasons of simplicity, these additional structures and/or processes are not specifically illustrated or discussed in detail herein.

Figure 27:
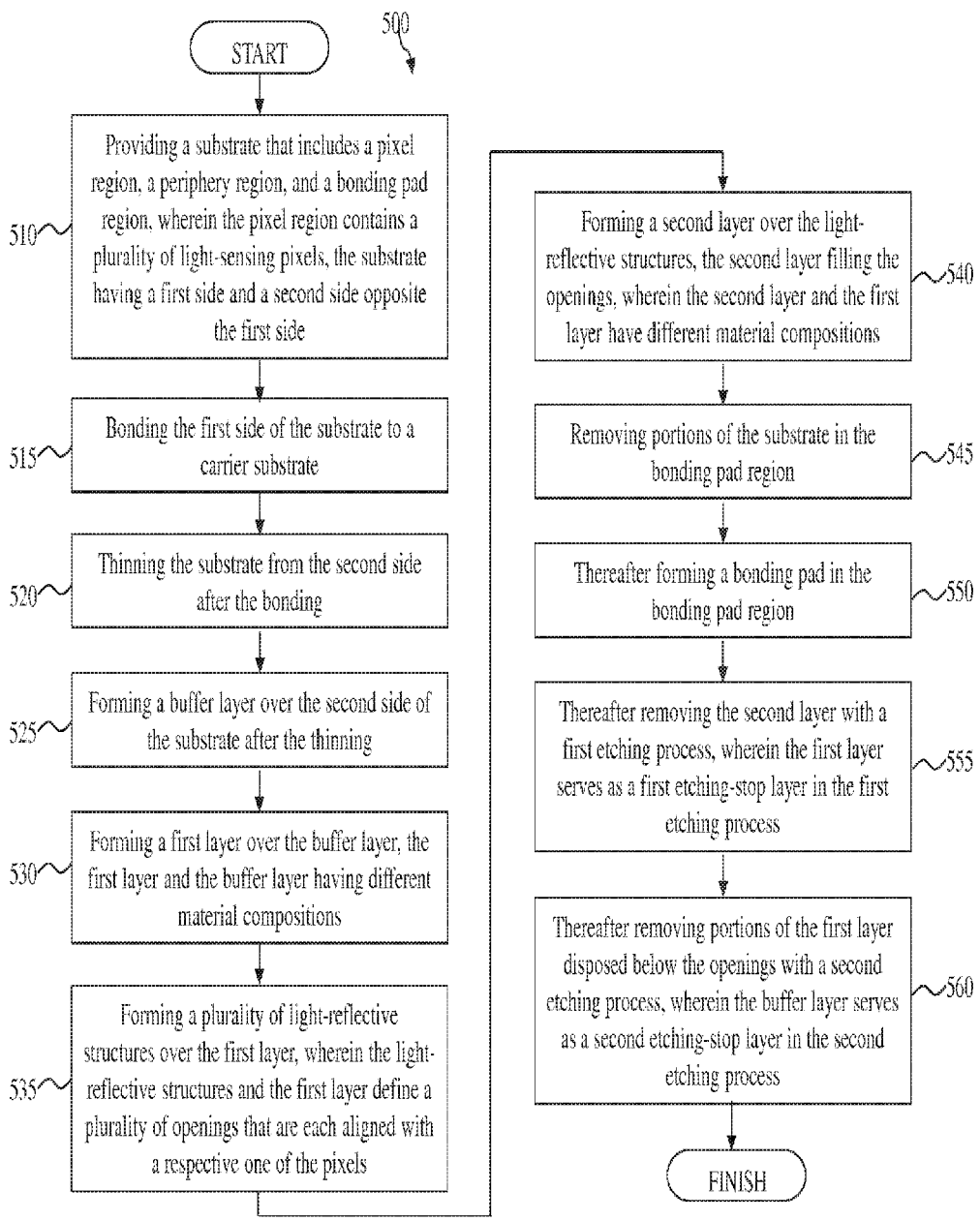
FIGS. 27-28 are flowcharts each illustrating a method of fabricating an image sensor device in accordance with some embodiments.

FIG. 27 is a simplified flowchart illustrating a method 500 of fabricating an image sensor device according to embodiments of the present disclosure. The method 500 includes a step 510 of providing a substrate that contains a plurality of radiation-sensing regions formed therein. The substrate has a first side and a second side. An interconnect structure may be formed over the first side of the substrate. The substrate (or the semiconductor image sensor device) has a pixel region, a periphery region, and a bonding pad region. The radiation-sensing regions are formed in the pixel region.

The method 500 includes a step 515 of bonding the first side of the substrate to a carrier substrate. The step 520 is performed such that the interconnect structure is bonded between the substrate and the carrier substrate.

The method 500 includes a step 520 of thinning the substrate from the second side after the bonding. In some embodiments, the thinning step 520 includes one or more chemical and/or mechanical grinding and polishing processes.

The method 500 includes a step 525 of forming a buffer layer over the second side of the substrate after the thinning. In some embodiments, the buffer layer contains silicon oxide;

The method 500 includes a step 530 of forming a first layer over the buffer layer, the first layer and the buffer layer having different material compositions. In some embodiments, the first layer contains silicon nitride, silicon carbide, silicon oxynitride, titanium nitride, tungsten, aluminum copper, or copper. In some embodiments, the step 530 of forming the first layer is performed such that the first layer has a thickness in a range from about 100 angstroms to about 1500 angstroms.

The method 500 includes a step 535 of forming a plurality of light-reflective structures over the first layer. The light-reflective structures and the first layer define a plurality of openings that are each aligned with a respective one of the pixels.

The method 500 includes a step 540 of forming a second layer over the light-reflective structures. The second layer fills the openings. The second layer and the first layer have different material compositions. In some embodiments, the second layer contains silicon oxide.

The method 500 includes a step 545 of removing portions of the substrate in the bonding pad region. This step may also be referred to as "opening" the bonding pad region.

The method 500 includes a step 550 of forming a bonding pad in the bonding pad region after the bonding pad region has been opened.

The method 500 includes a step 555 of removing the second layer with a first etching process. The first layer serves as a first etching-stop layer in the first etching process.

The method 500 includes a step 560 of removing portions of the first layer disposed below the openings with a second etching process. The buffer layer serves as a second etching-stop layer in the second etching process.

In some embodiments, the first etching process and material compositions of the first and second layers are configured such that the first and second layers have substantially different etching rates in the first etching process. In some embodiments, the second etching process and material compositions of the first layer and the buffer layer are configured such that the first layer and the buffer layer have substantially different etching rates in the second etching process.

It is understood that additional process steps may be performed before, during, or after the steps 510-560 discussed above to complete the fabrication of the semiconductor device. For example, an antireflective coating (ARC) layer may be formed between the substrate and the buffer layer. As another example, after the etching of the first layer, a passivation layer is formed over the light-reflective structures and over the buffer layer. The passivation layer partially fills the openings. Thereafter, a plurality of color filters may be formed in the openings. Additional steps may be performed to complete the image sensor fabrication, but they are not specifically discussed herein for reasons of simplicity.

Figure 28:
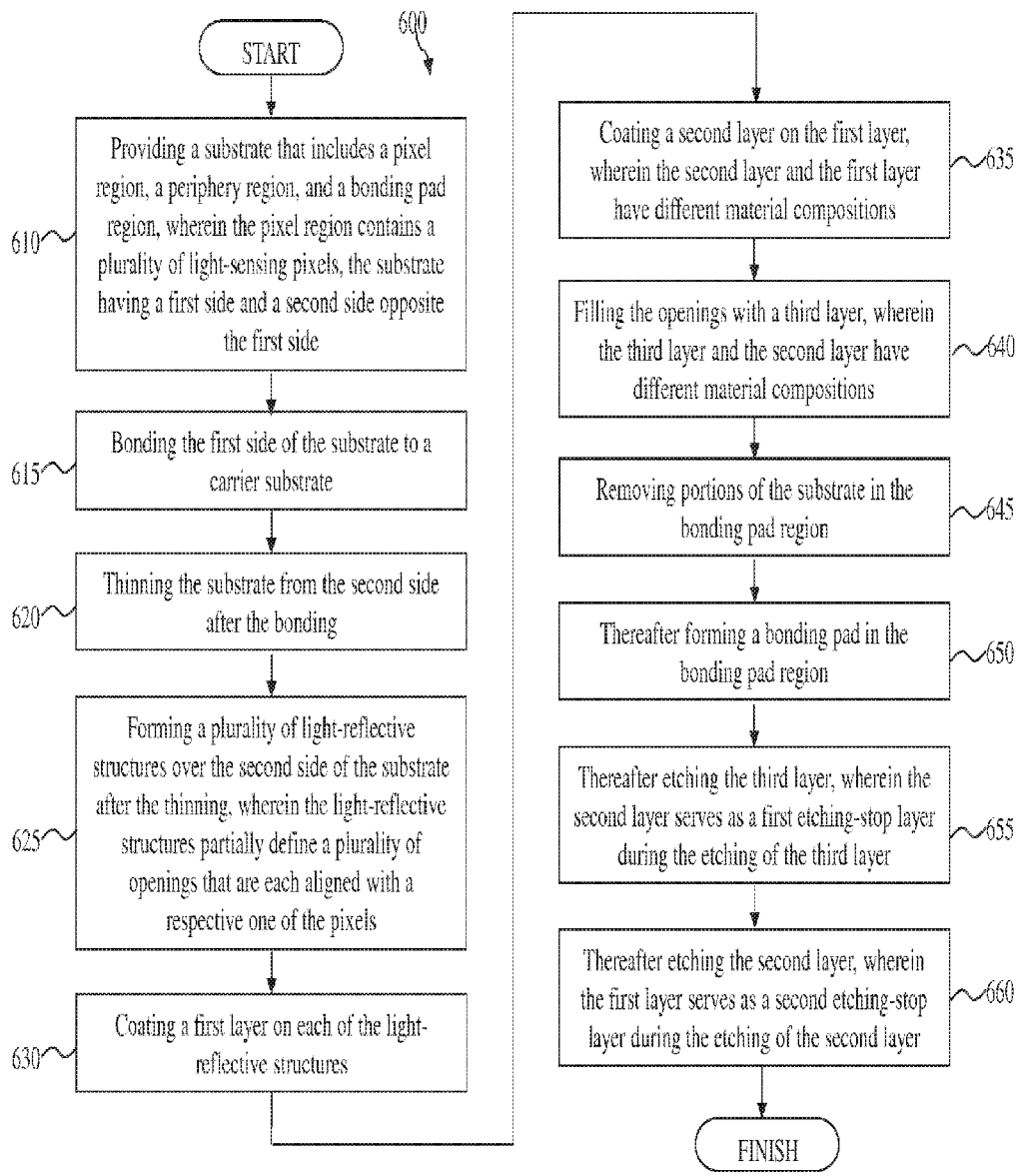

FIG. 28 is a simplified flowchart illustrating a method 600 of fabricating an image sensor device according to embodiments of the present disclosure. The method 600 includes a step 610 of providing a substrate that contains a plurality of radiation-sensing regions formed therein. The substrate has a first side and a second side. An interconnect structure may be formed over the first side of the substrate. The substrate (or the semiconductor image sensor device) has a pixel region, a periphery region, and a bonding pad region. The radiation-sensing regions are formed in the pixel region.

The method 600 includes a step 615 of bonding the first side of the substrate to a carrier substrate. The step 520 is performed such that the interconnect structure is bonded between the substrate and the carrier substrate.

The method 600 includes a step 620 of thinning the substrate from the second side after the bonding. In some embodiments, the thinning step 520 includes one or more chemical and/or mechanical grinding and polishing processes.

The method 600 includes a step 625 of forming a plurality of light-reflective structures over the second side of the substrate after the thinning. The light-reflective structures partially define a plurality of openings that are each aligned with a respective one of the pixels.

The method 600 includes a step 630 of coating a first layer on each of the light-reflective structures. In some embodiments, the first layer contains silicon oxide.

The method 600 includes a step 635 of coating a second layer on the first layer, wherein the second layer and the first layer have different material compositions. In some embodiments, the second layer contains silicon nitride, silicon carbide, silicon oxynitride, titanium nitride, tungsten, aluminum copper, or copper.

The method 600 includes a step 640 of filling the openings with a third layer. The third layer and the second layer have different material compositions. In some embodiments, the third layer contains silicon oxide.

The method 600 includes a step 645 of removing portions of the substrate in the bonding pad region.

The method 600 includes a step 650 of thereafter forming a bonding pad in the bonding pad region.

The method 600 includes a step 655 of thereafter etching the third layer. The second layer serves as a first etching-stop layer during the etching of the third layer.

The method 600 includes a step 660 of thereafter etching the second layer. The first layer serves as a second etching-stop layer during the etching of the second layer. In some embodiments, the etching of the second layer is performed using a dry etching process. This forms a plurality of spacers disposed over sidewalls of the light-structures. The spacers are portions of the second layer that remain after the etching of the second layer.

It is understood that additional process steps may be performed before, during, or after the steps 610-660 discussed above to complete the fabrication of the semiconductor device. For example, an antireflective coating (ARC) layer and a buffer layer may be formed between the substrate and the light-reflective structures. As another example, after the etching of the second layer, a plurality of color filters may be formed in the openings. Additional steps may be performed to complete the image sensor fabrication, but they are not specifically discussed herein for reasons of simplicity.

The embodiments of the present disclosure discussed above offer advantages over existing art, though it is understood that different embodiments may offer other advantages, not all advantages are necessarily discussed herein, and that no particular advantage is required for all embodiments. In more detail, conventional BSI image sensor fabrication process flows typically form a metal grid (i.e., light-blocking or light-reflective structures) in the back side before a conductive bonding pad is formed. The metal grid needs to be capped by a capping layer such as an oxide layer. This capping layer has to be flattened in subsequent processes, and it will be difficult to remove this capping layer over the metal grid before the bonding pad is formed. As a result, color filters have to be coated over a flat surface of the capping layer. In other words, the conventional fabrication process flow for BSI image sensors lead to the color filters being formed over and above the metal grid, rather than being embedded within the trenches or openings partially defined by the metal grid. As such, the conventional BSI image sensors have a longer optical path between the color filters and pixels, as well as gaps between the color filters and the metal grid from which light can escape. Moreover, the disposition of the color filters over and above the metal grid requires the metal grid to be accurately aligned with the color filters (or more precisely, the gaps separating adjacent color filters). For these reasons discussed above, conventional image sensors tend to suffer from cross-talk issues and/or have degraded performance in terms of optical loss or quantum efficiency.

In contrast, embodiments of the present disclosure facilitate the formation of buried or embedded color filters. In more detail, the embodiments discussed above with reference to FIGS. 1-15 and 27 implements an etching-stop layer to allow the oxide capping layer to be removed without damaging the buffer layer (or other layer in the optical path of the image sensor) below. The embodiments discussed above with reference to FIGS. 16-26 and 28 utilizes an ONO-like structure to also allow the oxide capping layer to be removed without damaging the buffer layer (or other layer in the optical path of the image sensor) below.

In each of these two embodiments discussed above, a metal grid is formed that defines openings that are reserved for the formation of buried color filters. Stated differently, according to the embodiments of the present disclosure, the color filters can be formed to be embedded or buried in the openings defined by the metal grid, rather than being formed on a flat surface above the metal grid. Consequently, the metal grid can more effectively prevent the light from incorrectly entering an adjacent pixel (since the metal grid is at the same level as the color filters), thereby reducing cross-talk. The fact that the color filters are formed within the openings defined by the metal grid also means that the color filters are "self-aligned", thereby obviating any alignment constraints between the metal grid and the color filters. In addition, the shorter optical path between the color filters and the pixels increases light reception and enhances quantum efficiency.

One embodiment of the present disclosure pertains to a semiconductor image sensor device. The image sensor device includes a substrate having a first side and a second side that is opposite the first side. An interconnect structure is disposed over the first side of the substrate. A plurality of radiation-sensing regions is located in the substrate. The radiation-sensing regions are configured to sense radiation that enters the substrate from the second side. A buffer layer is disposed over the second side of the substrate. A plurality of elements is disposed over the buffer layer. The elements and the buffer layer have different material compositions. A plurality of light-blocking structures is disposed over the plurality of elements, respectively. The radiation-sensing regions are respectively aligned with a plurality of openings defined by the light-blocking structures, the elements, and the buffer layer.

Another embodiment of the present disclosure pertains to a semiconductor image sensor device. The image sensor device includes a substrate having a front side and a back side that is opposite the front side. An interconnect structure is disposed over the first side of the substrate. A plurality of pixels is located in the substrate. The pixels are each configured to detect light that enters the substrate from the back side. A dielectric layer is disposed over the back side of the substrate. A plurality of light-reflective structures is disposed over the back side of the substrate. A plurality of segments is each disposed between the dielectric layer and a respective one of the light-reflective structures. The segments each contain a metal material or a dielectric material different from the dielectric layer. A plurality of color filters is disposed between the light-reflective structures. Each of the color filters is aligned with a respective one of the pixels.

Yet another embodiment of the present disclosure pertains to a method of fabricating a semiconductor image sensor device. A substrate is provided. The substrate comprises a pixel region, a periphery region, and a bonding pad region. The pixel region contains a plurality of radiation-sensing regions. The first side of the substrate is bonded to a carrier substrate. Thereafter, the substrate is thinned from a second side opposite the first side. A buffer layer is formed over the second side of the substrate after the thinning. A first layer is formed over the buffer layer. The first layer and the buffer layer have different material compositions. A plurality of light-reflective structures is formed over the first layer. The light-reflective structures and the first layer define a plurality of openings that are each aligned with a respective one of the pixels. A second layer is formed over the light-reflective structures. The second layer fills the openings. The second layer and the first layer have different material compositions. Portions of the substrate in the bonding pad region are removed. Thereafter a bonding pad is formed in the bonding pad region. Thereafter, the second layer is removed with a first etching process. The first layer serves as a first etching-stop layer in the first etching process. Thereafter, portions of the first layer disposed below the openings are removed with a second etching process. The buffer layer serves as a second etching-stop layer in the second etching process.

Another one embodiment of the present disclosure pertains to a semiconductor image sensor device. The image sensor device includes a substrate having a first side and a second side that is opposite the first side. An interconnect structure is disposed over the first side of the substrate. A plurality of radiation-sensing regions are located in the substrate. The radiation-sensing regions are configured to sense radiation that enters the substrate from the second side. A plurality of light-blocking structures is disposed over the second side of the substrate. A passivation layer is coated on top surfaces and sidewalls of each of the light-blocking structures. A plurality of spacers is disposed on portions of the passivation layer coated on the sidewalls of the light-blocking structures.

Another embodiment of the present disclosure pertains to a semiconductor image sensor device. The image sensor device includes a substrate having a front side and a back side that is opposite the front side. An interconnect structure is disposed over the first side of the substrate. A plurality of pixels is located in the substrate. The pixels are each configured to detect light that enters the substrate from the back side. A plurality of light-reflective structures is disposed over the back side of the substrate. A passivation layer is coated on top surfaces and sidewalls of each of the light-reflective structures. A plurality of spacers is disposed on portions of the passivation layer coated on the sidewalls of the light-reflective structures but not over the top surfaces of the light-reflective structures. The spacers and the passivation layer have material compositions that are configured such that the spacers and the passivation layer have substantially different etching rates. A plurality of color filters is disposed between the light-reflective structures. The color filters are each aligned with a respective one of the pixels. The color filters are isolated from the light-reflective structures by the passivation layer and the spacers.

Yet another embodiment of the present disclosure pertains to a method of fabricating a semiconductor image sensor device. A substrate is provided. The substrate comprises a pixel region, a periphery region, and a bonding pad region. The pixel region contains a plurality of radiation-sensing regions. The first side of the substrate is bonded to a carrier substrate. Thereafter, the substrate is thinned from a second side opposite the first side. A plurality of light-reflective structures is formed over the second side of the substrate after the thinning. The light-reflective structures partially define a plurality of openings that are each aligned with a respective one of the pixels. A first layer is coated on each of the light-reflective structures. A second layer is coated on the first layer. The second layer and the first layer have different material compositions. The openings are filled with a third layer. The third layer and the second layer have different material compositions. Portions of the substrate in the bonding pad region are removed. Thereafter, a bonding pad is formed in the bonding pad region. Thereafter, the third layer is etched. The second layer serves as a first etching-stop layer during the etching of the third layer. Thereafter, the second layer is etched. The first layer serves as a second etching-stop layer during the etching of the second layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor image sensor device, comprising:
    bonding a first side of a device substrate to a carrier substrate, the device substrate including a pixel region and a bonding pad region, wherein the pixel region contains a plurality of light-sensing pixels configured to sense radiation that enters the device substrate from a second side opposite the first side;
    thinning the device substrate from the second side;
    forming a plurality of light-reflective structures over the second side of the device substrate after the thinning, the light-reflective structures partially defining a plurality of openings;
    forming a first layer over each of the light-reflective structures;
    forming a second layer over the first layer, the first layer and the second layer having different material compositions; and
    filling the openings with a third layer, the third layer and the second layer having different material compositions.

2. The method of claim 1, further comprising:
    removing portions of the substrate in the bonding pad region; and
    forming a bonding pad in the bonding pad region after the removing.

3. The method of claim 1, further comprising:
    etching the third layer; and
    etching the second layer after the etching of the third layer.

4. The method of claim 3, wherein the second layer serves as an etching-stop layer during the etching of the third layer.

5. The method of claim 3, wherein the first layer serves as an etching-stop layer during the etching of the second layer.

6. The method of claim 3, further comprising: after the etching of the second layer, forming a respective color filter in each of the openings.

7. The method of claim 3, wherein the etching of the second layer is performed using a dry etching process.

8. The method of claim 3, wherein the etching of the second layer forms a plurality of spacers disposed over sidewalls of the light-reflective structures, the spacers being portions of the second layer that remain after the etching of the second layer.

9. The method of claim 1, wherein each of the openings is vertically aligned with a respective one of the light-sensing pixels.

10. The method of claim 1, wherein the forming of the first layer, the forming of the second layer, and the forming of the third layer are performed in a manner such that the first layer and the third layer contain identical materials.

11. The method of claim 10, wherein:
    the first layer and the third layer each contain silicon oxide; and
    the second layer contains silicon nitride, silicon carbide, silicon oxynitride, titanium nitride, tungsten, aluminum copper, or copper.

12. The method of claim 1, wherein the device substrate further comprises a periphery region that is different from the pixel region and the bonding pad region, the periphery region being configured to be kept optically dark.

13. The method of claim 1, further comprising: forming an antireflective coating (ARC) layer and a buffer layer between the device substrate and the light-reflective structures.

14. A method of fabricating a semiconductor image sensor device, comprising:
    providing a substrate that includes a pixel region, a periphery region, and a bonding pad region, wherein the pixel region contains a plurality of light-sensing pixels, the substrate having a first side and a second side opposite the first side;
    bonding the first side of the substrate to a carrier substrate;
    thinning the substrate from the second side after the bonding;
    forming a plurality of light-reflective structures over the second side of the substrate after the thinning, wherein the light-reflective structures partially define a plurality of openings that are each aligned with a respective one of the pixels;
    coating a first layer on each of the light-reflective structures;
    coating a second layer on the first layer, wherein the second layer and the first layer have different material compositions;
    filling the openings with a third layer, wherein the third layer and the second layer have different material compositions;
    removing portions of the substrate in the bonding pad region;
    thereafter forming a bonding pad in the bonding pad region;
    hereafter etching the third layer, wherein the second layer serves as a first etching-stop layer during the etching of the third layer; and
    thereafter etching the second layer, wherein the first layer serves as a second etching-stop layer during the etching of the second layer.

15. The method of claim 14, further comprising: after the etching of the second layer, forming a plurality of color filters in the openings.

16. The method of claim 14, wherein the etching of the second layer is performed using a dry etching process, thereby forming a plurality of spacers disposed over sidewalls of the light-reflective structures, the spacers being portions of the second layer that remain after the etching of the second layer.

17. The method of claim 14, wherein the forming of the first layer, the forming of the second layer, and the filling the openings with a third layer are performed in a manner such that:
the first layer contains silicon oxide; and
the second layer contains silicon nitride, silicon carbide, silicon oxynitride, titanium nitride, tungsten, aluminum copper, or copper; and
the third layer contains silicon oxide.

18. The method of claim 14, further comprising forming an antireflective coating (ARC) layer and a buffer layer between the substrate and the light-reflective structures.

19. A method of fabricating a semiconductor image sensor device, comprising:
bonding a first side of a device substrate to a carrier substrate, the device substrate including a pixel region and a bonding pad region, wherein the pixel region contains a plurality of light-sensing elements;
thinning, after the bonding, the device substrate from a second side opposite the first side;
forming a plurality of light-reflective components over the second side of the device substrate after the thinning, wherein the light-reflective components help define a plurality of trenches that are each vertically aligned with a respective one of the light-sensing elements;
coating a first layer on each of the light-reflective components, the first layer containing a first type dielectric material;
coating a second layer on the first layer, the second layer containing a second type dielectric material;
filling the trenches with a third layer, the third layer containing the first type dielectric material;
etching the third layer, wherein the second layer serves as a first etching-stop layer during the etching of the third layer;
thereafter etching the second layer using a dry etching process, wherein the first layer serves as a second etching-stop layer during the etching of the second layer, and wherein a plurality of spacers are formed on sidewalls of the light-reflective components by portions of the second layer that remain after the etching of the second layer; and
forming, after the etching of the second layer, a plurality of color filters in the plurality of trenches, respectively.

20. The method of claim 19, further comprising:
forming an antireflective coating (ARC) layer and a buffer layer between the device substrate and the light-reflective components;
removing portions of the device substrate in the bonding pad region after the third layer has been formed; and
thereafter forming a bonding pad in the bonding pad region.

* * * * *